(12) United States Patent
Zhao et al.

(10) Patent No.: US 11,038,000 B2
(45) Date of Patent: Jun. 15, 2021

(54) DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Yong Zhao, Hubei (CN); Liang Sun, Hubei (CN); Shoucheng Wang, Hubei (CN); Yaojen Chang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 16/499,270

(22) PCT Filed: May 29, 2019

(86) PCT No.: PCT/CN2019/088934
§ 371 (c)(1),
(2) Date: Sep. 29, 2019

(87) PCT Pub. No.: WO2020/155482
PCT Pub. Date: Aug. 6, 2020

(65) Prior Publication Data
US 2020/0251532 A1    Aug. 6, 2020

(51) Int. Cl.
*H01L 27/32* (2006.01)

(52) U.S. Cl.
CPC ........ *H01L 27/326* (2013.01); *H01L 27/3216* (2013.01); *H01L 27/3218* (2013.01)

(58) Field of Classification Search
CPC .................. H01L 27/326; H01L 27/3218
See application file for complete search history.

(56) References Cited

U.S. PATENT DOCUMENTS

| 2014/0326958 | A1  | 11/2014 | Chung et al. |
| 2016/0035799 | A1  | 2/2016  | Chang |
| 2019/0140030 | A1* | 5/2019  | Huangfu ............. H01L 27/3246 |
| 2019/0251895 | A1* | 8/2019  | Zhang ...................... G09G 3/32 |
| 2020/0127060 | A1* | 4/2020  | Li ........................ H01L 27/3218 |

FOREIGN PATENT DOCUMENTS

| CN | 103985738 A | * | 8/2014 | ......... H01L 27/3216 |
| CN | 204332265 U |   | 5/2015 | |
| CN | 105023934 A | * | 11/2015 | |
| CN | 207966982 U |   | 10/2018 | |
| CN | 207966993 U |   | 10/2018 | |

* cited by examiner

*Primary Examiner* — Selim U Ahmed
*Assistant Examiner* — Evan G Clinton
(74) *Attorney, Agent, or Firm* — Mark M. Friedman

(57) ABSTRACT

A display panel is provided. The display panel includes at least two first pixels, at least two second pixels, and at least two third pixels. An area of the first pixel, an area of the second pixel, and an area of the third pixel are inversely proportional to a luminous efficiency of a luminescent material of the first pixel, a luminous efficiency of a luminescent material of the second pixel, and a luminous efficiency of a luminescent material of the third pixel, respectively. The disclosure can avoid the drawback of color shift of the display panel.

17 Claims, 9 Drawing Sheets

DISPLAY PANEL

FIELD OF INVENTION

This disclosure relates to display technology, and more particularly, to a display panel.

BACKGROUND OF INVENTION

A luminescent material layer of a pixel in a conventional organic light emitting diode (OLED) display panel is generally formed by an evaporation process.

In the formed pixels, areas of a red pixel, a green pixel, and a blue pixel are all equal, and this causes a problem of color shift of the conventional OLED display panel after a long-term displaying.

Therefore, it is necessary to provide a new technical solution to solve the above technical drawback.

SUMMARY OF INVENTION

An object of the disclosure is to provide a display panel that prevents the drawback of color shift of the conventional OLED display panel.

In order to solve the above-mentioned drawback, the disclosure provides a technical solution as follow.

The disclosure provides a display panel. The display panel comprises at least two pixel repeating units. The at least two of the pixel repeating units are arranged in an array, and the pixel repeating unit comprises a first pixel, a second pixel, and a third pixel. An area of the first pixel, an area of the second pixel, and an area of the third pixel are inversely proportional to a luminous efficiency of a luminescent material of the first pixel, a luminous efficiency of the luminescent material of the second pixel, and luminous efficiency of the luminescent material of the third pixel, respectively. The first pixel, the second pixel, and the third pixel are different ones from each other of a red pixel, a green pixel, and a blue pixel. A shape of the first pixel, a shape of the second pixel, and a shape of the third pixel is a convex arc and/or a concave arc. A shape of an edge portion of two of the first pixel, the second pixel, and the third pixel is complementary to one of a first direction, a second direction, a third direction, and a fourth direction. The first direction is perpendicular to the second direction, the third direction is a direction having an angle of less than 90 degrees with the first direction, and the fourth direction is perpendicular to the third direction.

In the display panel of the disclosure, a ratio of an area of the red pixel to an area of the green pixel is within a range of 0.1 to 3, and a ratio of an area of the blue pixel to the area of the green pixel is within the range of 0.3 to 4.

In the display panel of the disclosure, the ratio of the area of the red pixel to the area of the green pixel is within a range of 0.2 to 2.2, and the ratio of the area of the blue pixel to the area of the green pixel is within the range of 0.5 to 3.6.

In the display panel of the disclosure, at least two of the first pixel, the second pixel, and the third pixel are arranged alternately in at least one of the first direction, the second direction, the third direction, and the fourth direction.

The disclosure further provides a display panel. The display panel comprises at least two pixel repeating units. The at least two of the pixel repeating units are arranged in an array, and the pixel repeating unit comprises a first pixel, a second pixel, and a third pixel. An area of the first pixel, an area of the second pixel, and an area of the third pixel are inversely proportional to a luminous efficiency of a luminescent material of the first pixel, a luminous efficiency of the luminescent material of the second pixel, and luminous efficiency of the luminescent material of the third pixel, respectively.

In the display panel of the disclosure, a ratio of an area of the red pixel to an area of the green pixel is within a range of 0.1 to 3, and a ratio of an area of the blue pixel to the area of the green pixel is within the range of 0.3 to 4.

In the display panel of the disclosure, the ratio of the area of the red pixel to the area of the green pixel is within a range of 0.2 to 2.2, and the ratio of the area of the blue pixel to the area of the green pixel is within the range of 0.5 to 3.6.

In the display panel of the disclosure, a shape of the first pixel, a shape of the second pixel, and a shape of the third pixel is a convex arc and/or a concave arc, and a shape of an edge portion of two of the first pixel, the second pixel, and the third pixel is complementary to one of a first direction, a second direction, a third direction, and a fourth direction, and wherein the first direction is perpendicular to the second direction, the third direction is a direction having an angle of less than 90 degrees with the first direction, and the fourth direction is perpendicular to the third direction.

In the display panel of the disclosure, at least two of the first pixel, the second pixel, and the third pixel are arranged alternately in at least one of the first direction, the second direction, the third direction, and the fourth direction.

In the display panel of the disclosure, a width of a gap between two of the first pixel, the second pixel, and the third pixel alternately arranged in the third direction is equal to a width of a gap between two of the first pixel, the second pixel, and the third pixel alternately arranged in the fourth direction.

In the display panel of the disclosure, a shape of the first pixel is a circular shape or an elliptical shape, a shape of the second pixel is one of shapes including a convex arc and/or a concave arc, and a shape of the third pixel is a shape of the combination of a concave arc or a concave arc and a convex arc.

In the display panel of the disclosure, when the shape of the first pixel is the elliptical shape, a ratio of a long axis to a short axis of the elliptical shape is within the range of 1 to 5.

In the display panel of the disclosure, the ratio of the long axis to the short axis of the elliptical shape is within the range of 1 to 3

In the display panel of the disclosure, a shape of an edge portion of one of the second pixel and the third pixel in the third direction and the fourth direction corresponds to the concave arc, and a sum of a radius of curvature of a shape of an edge portion of the first pixel toward one of the second pixel and the third pixel and a width of a predetermined gap is equal to a radius of curvature of a concave arc corresponding to an edge portion of one of the second pixel and the third pixel in the third direction and the fourth direction.

In the display panel of the disclosure, the predetermined gap is a gap between one of an edge portion of one of the second pixel and the third pixel and an edge portion of an adjacent first pixel in one of the third direction and the fourth direction, and a width of the predetermined gap in the third direction is equal to a width of the predetermined gap in the fourth direction.

In the display panel of the disclosure, when the shape of the first pixel is the elliptical shape, a long axis of the elliptical shape directs to one of the second pixel and the third pixel, and a short axis of the elliptical shape directs to the other one of second pixel and the third pixel.

In the display panel of the disclosure, a predetermined shape is constituted of an arc corresponding to an edge portion of the third pixel toward the first pixel and its extended arc and an arc corresponding to an edge portion of the second pixel toward the first pixel and its extended arc, and a center of the shape of the first pixel is the same as a center of the predetermined shape.

In the display panel of the disclosure, the shape of the first pixel is the same or is a similar shape as the predetermined shape.

In the display panel of the disclosure, shape, size, and area of any one of the first pixel, the second pixel, and the third pixel are different.

In the disclosure, since an area of the first pixel, an area of the second pixel, and an area of the third pixel are inversely proportional to a luminous efficiency of a luminescent material of the first pixel, a luminous efficiency of the luminescent material of the second pixel, and luminous efficiency of the luminescent material of the third pixel, respectively, the drawback of color shift of the display panel can be avoided.

In order to more clearly illustrate the embodiments of the present invention or the technical solutions in the prior art, the following briefly introduces the accompanying drawings used in the embodiments.

DETAILED DESCRIPTION OF PREFERRED EMBODIMENTS

The term "embodiment" as used in this disclosure means an example, an instance or an illustration. In addition, the term "a" in the specification and the claims may be generally interpreted as "one or more" unless specified or the context clearly dictates otherwise.

Any two of the first embodiment, the second embodiment, the third embodiment, and the fourth embodiment of a display panel 10 of the disclosure are similar or alike.

In the first embodiment, the second embodiment, the third embodiment, and the fourth embodiment of the disclosure, the display panel 10 can be, for example, an organic light emitting diode (OLED) display panel or the like.

The display panel comprises at least two pixel repeating units. The at least two of the pixel repeating units are arranged in an array (one-dimensional array or two-dimensional array). The pixel repeating unit includes a first pixel 101, a second pixel 102, a third pixel 103, and at most one of the first pixel 101, the second pixel 102, and the third pixel 103.

Figure 1:
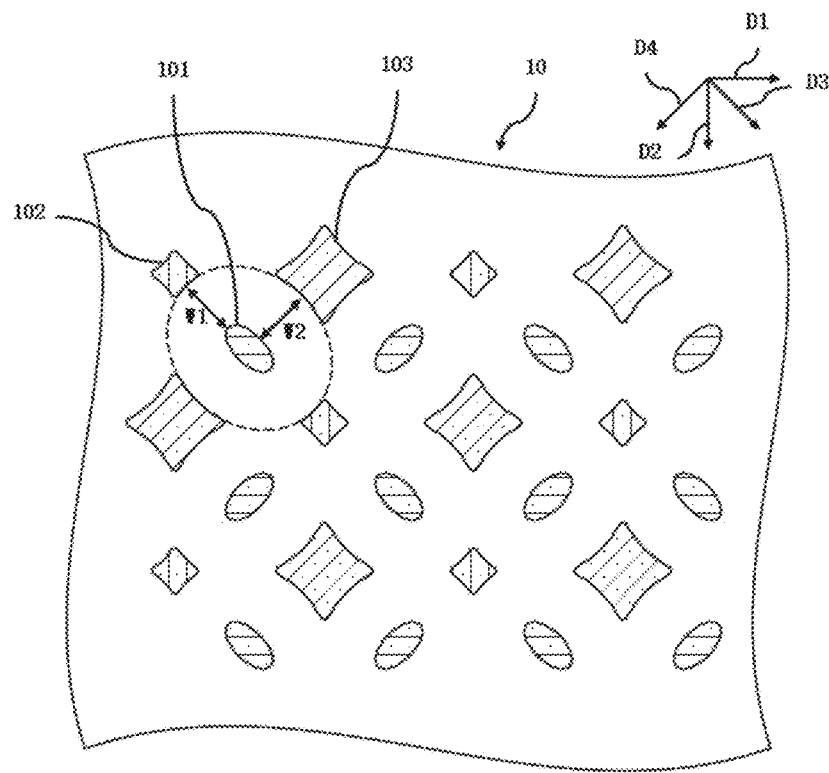
FIG. 1 is a schematic diagram of a first embodiment of a display panel of this disclosure.
Figure 2:
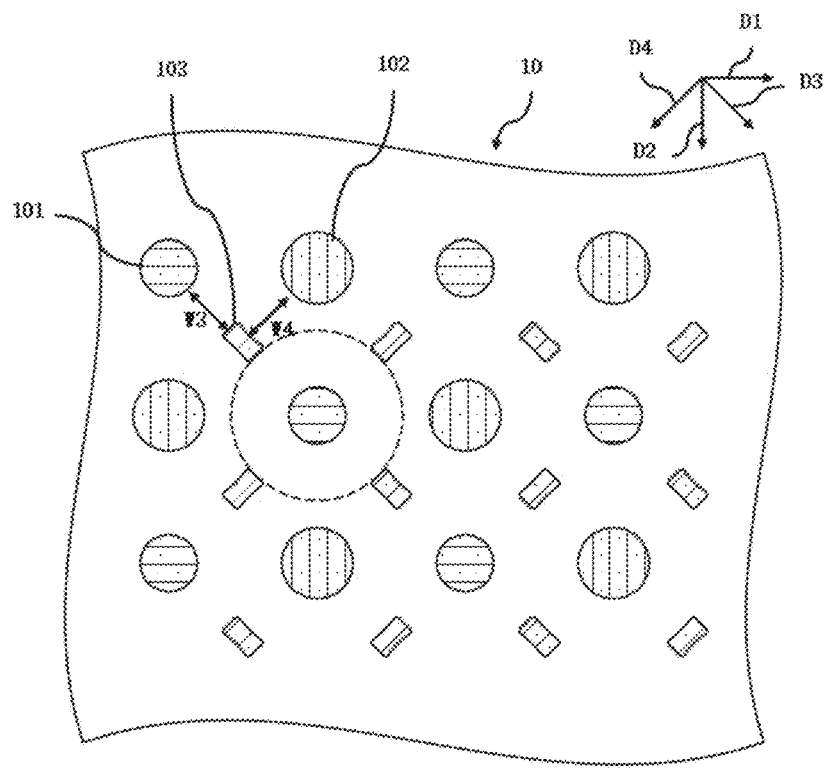
FIG. 2 is a schematic diagram of a second embodiment of a display panel of this disclosure.
Figure 3:
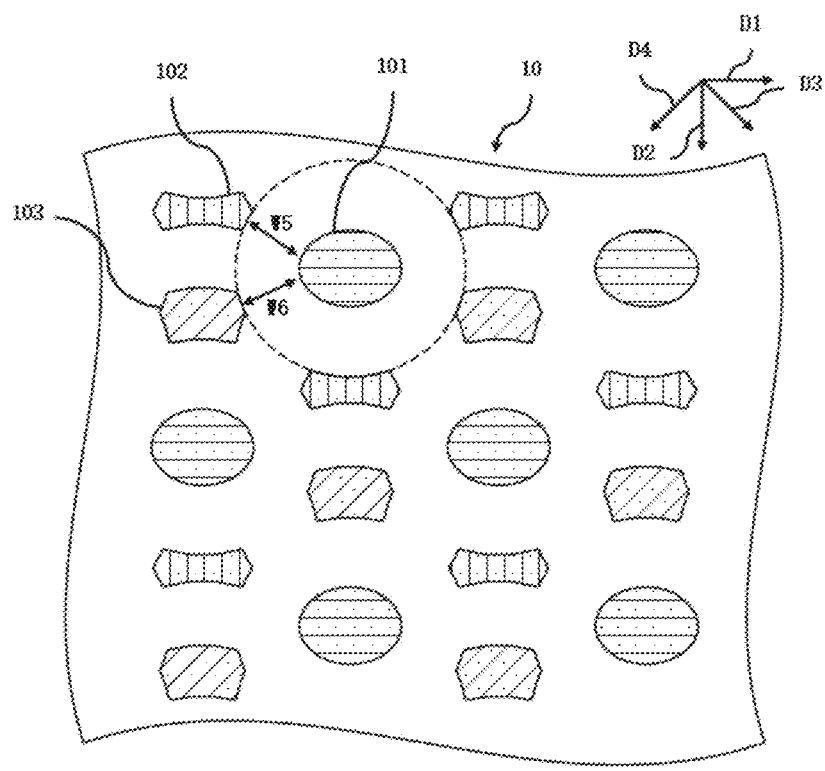
FIG. 3 is a schematic diagram of a third embodiment of a display panel of this disclosure.
Figure 4:
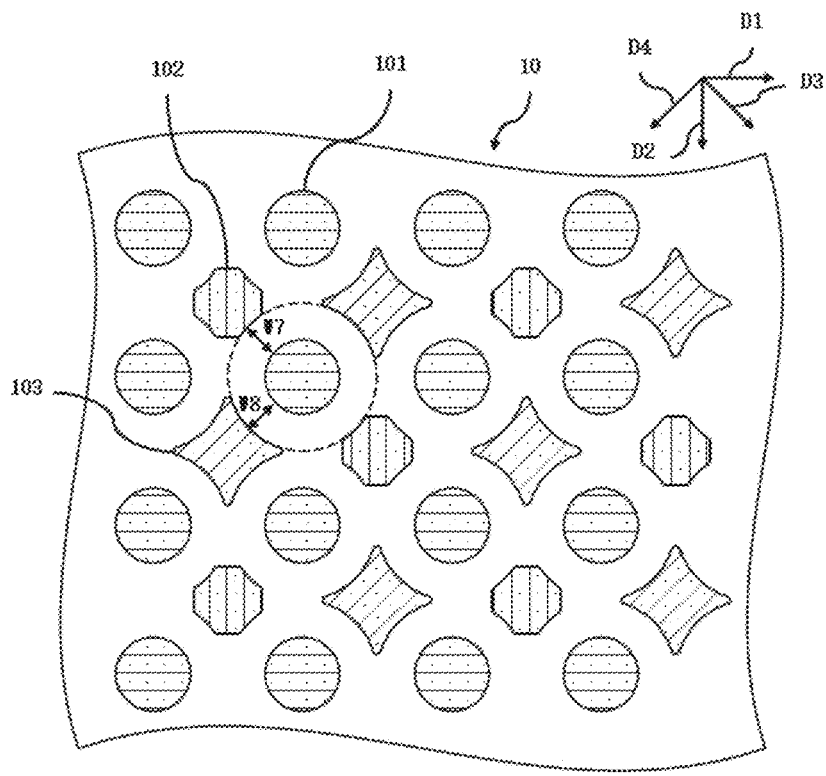
FIG. 4 is a schematic diagram of a fourth embodiment of a display panel of this disclosure.

For example, the pixel repeating unit includes one first pixel 101, one second pixel 102, and one third pixel 103, as shown in FIG. 3, or the pixel repeating unit includes two first pixels 101, one second pixel 102, and one third pixel 103, as shown in FIG. 1 and FIG. 4, or the pixel repeating unit includes one first pixel 101, two second pixels 102, and one third pixel 103, or the pixel repeating unit includes one first pixel 101, one second pixel 102, and two third pixels 103, as shown in FIG. 2.

The first pixel 101, the second pixel 102, and the third pixel 103 are a red pixel, a green pixel, and a blue pixel, and different from one another.

A shape of the first pixel 101, a shape of the second pixel 102, and a shape of the third pixel 103 is formed by a convex arc and/or a concave arc (connected).

Specifically, a shape of at least one of the first pixel 101, the second pixel 102, and the third pixel 103 is formed by a convex arc. The shape of at most two of the first pixel 101, the second pixel 102, and the third pixel 103 is a convex arc. The shape of the remaining at most two of the first pixel 101, the second pixel 102, and the third pixel 103 is a concave arc. Alternatively, the remaining at most two of the first pixel 101, the second pixel 102, and the third pixel 103 are formed by convex arcs and the concave arcs (two ends of an outer convex arc are respectively connected to two concave arcs). At least one of the first pixel 101, the second pixel 102, and the third pixel 103 is circular or elliptical, and at most two of the first pixel 101, the second pixel 102, and the third pixel 103 are circular or elliptical.

A shape of edge portions of two of the first pixel 101, the second pixel 102, and the third pixel 103 is complementary to one of a first direction D1, a second direction D2, a third direction D3, and a fourth direction D4. The first direction D1 is perpendicular to the second direction D2. The third direction D3 is a direction having an angle of less than 90 degrees with the first direction D1. The fourth directions D4 is perpendicular to the third direction D3.

The term "complementary" means that the two shapes respectively have opposing protrusions and recesses. When the two shapes are moved toward each other by opposing movement, the protrusions of the two shapes are fitted with the recesses, or are embedded with each other.

For example, as shown in FIG. 1, the first pixel 101 and the second pixel 102 respectively have a protrusion and a recess in the third direction D3, and the first pixel 101 is complementary to the second pixel 102 in the third direction D3. The first pixel 101 and the third pixel 103 respectively have a protrusion and a recess in the fourth direction D4, the first pixel 101 is complementary to the third pixel 103 in the fourth direction D4.

As shown in FIG. 2, the first pixel 101 and the third pixel 103 respectively have a protrusion and a recess in the third direction D3, and the first pixel 101 is complementary to the third pixel 103 in the third direction D3. The second pixel 102 and the third pixel 103 respectively have a protrusion and a recess in the fourth direction D4, and the second pixel 102 is complementary to the third pixel 103 in the fourth direction D4.

As shown in FIG. 3, the first pixel 101 and the second pixel 102 respectively have a protrusion and a recess in the third direction D3, and the first pixel 101 is complementary to the second pixel 102 in the third direction D3. The first pixel 101 and the third pixel 103 respectively have a protrusion and a recess in the fourth direction D4, and the first pixel 101 is complementary to the third pixel 103 in the fourth direction D4. The second pixel 102 and the third pixel 103 respectively have a protrusion and a recess in the second direction D2, and the second pixel 102 is complementary to the third pixel 103 in the second direction D2.

As shown in FIG. 4, the first pixel 101 and the second pixel 102 respectively have a protrusion and a recess in the third direction D3, and the first pixel 101 is complementary to the second pixel 102 in the third direction D3. The first pixel 101 and the third pixel 103 respectively have a protrusion and a recess in the fourth direction D4, and the first pixel 101 is complementary to the third pixel 103 in the fourth direction D4.

At least two of the first pixel 101, the second pixel 102, and the third pixel 103 are alternately arranged in at least one of the first direction D1, the second direction D2, the third direction D3, and the fourth direction D4.

Specifically, at least one of the first pixels 101 is located in a range surrounded by at least four second pixels 102, and at least one of the first pixels 101 is located in a range surrounded by at least four third pixels 103. At least one of the second pixels 102 is located in a range surrounded by at least four first pixels 101, and at least one of the second pixels 102 is located in a range surrounded by at least four third pixels 103. At least one of the third pixel 103 is located in a range surrounded by at least four first pixels 101, and at least one of the third pixels 103 is located in a range surrounded by at least four second pixels 102.

As shown in FIG. 1, the second pixel 102 and the third pixel 103 are alternately arranged in the first direction D1 and the second direction D2, and the first pixel 101 and the second pixel 102 are alternately arranged in the third direction D3. The first pixel 101 and the third pixel 103 are alternately arranged in the fourth direction D4.

As shown in FIG. 2, the second pixel 102 and the third pixel 103 are alternately arranged in the first direction D1 and the second direction D2, and the first pixel 101 and the second pixel 102 are alternately arranged in the third direction D3. The first pixel 101 and the third pixel 103 are alternately arranged in the fourth direction D4.

As shown in FIG. 3, the first pixel 101, the second pixel 102, and the third pixel 103 are alternately arranged in the second direction D2, the third direction D3, and the fourth direction D4. The second pixel 102 and the third pixel 103 are disposed around the first pixel 101, and the second pixel 102 and the third pixel 103 are spaced apart.

As shown in FIG. 4, the second pixel 102 and the third pixel 103 are alternately arranged in the first direction D1 and the second direction D2, and the first pixel 101 and the second pixel 102 are alternately arranged in the third direction D3. The first pixel 101 and the third pixel 103 are alternately arranged in the fourth direction D4.

A first gap is disposed between the first pixel 101 and an adjacent second pixel 102, and a second gap is disposed between the second pixel 102 and an adjacent third pixel 103. A third gap is disposed between the third pixel 103 and an adjacent first pixel 101.

At least a portion of the third pixel 103 is protruding toward the first gap, at least a portion of the first pixel 101 is protruding toward the second gap, and at least a portion of the second pixel 102 is protruding toward the third gap.

A width of a gap between two of the first pixel 101, the second pixel 102, and the third pixel 103 alternately arranged in the third direction D3 is equal to a width of a gap between two of the first pixel 101, the second pixel 102, and the third pixel 103 alternately arranged in the fourth direction D4.

As shown in FIG. 1, a width W1 of a gap between the first pixel 101 and the second pixel 102 in the third direction D3 is equal to a width W2 of a gap between the first pixel 101 and the third pixel 103 in the fourth direction D4.

Referring to FIG. 2, a width W3 of a gap between the first pixel 101 and the third pixel 103 in the third direction D3 is equal to a width W4 of a gap between the third pixel 103 and the second pixel 102 in the fourth direction D4.

Referring to FIG. 3, a width W5 of a gap between the first pixel 101 and the second pixel 102 in the third direction D3 is equal to a width W6 of a gap between the first pixel 101 and the third pixel 103 in the fourth direction D4.

Referring to FIG. 4, a width W7 of a gap between the first pixel 101 and the second pixel 102 in the third direction D3 is equal to a width W8 of a gap between the first pixel 101 and the third pixel 103 in the fourth direction D4.

A shape of the first pixel 101 is a circular shape or an elliptical shape, a shape of the second pixel 102 is one of shapes including convex arcs and/or concave arcs, and a shape of the third pixel 103 is a shape of concave arcs or a combination of concave arcs and convex arcs. Besides, the circular shape or the elliptical shape is one of shapes composed of convex arcs. Of course, the shape formed by the convex arcs may include other shapes.

The shape formed by a convex arc and/or a concave arc includes: a shape formed by an outer convex arc, a shape composed of four concave arcs, a shape composed of six concave arcs, a shape composed of a convex arc and five concave arcs, a shape composed of eight concave arcs, a shape composed of four convex arcs and four concave arcs, a shape composed of six concave arcs and six convex arcs, a shape composed of seven convex arcs and five concave arcs, and a shape composed of eight concave arc and eight convex arc.

In the shape composed of four concave arcs, the four concave arcs are connected end to end.

In the shape composed of six concave arcs, the six concave arcs are connected end to end.

In the shape composed of one convex arc and five concave arcs, the convex arc and the five concave arcs are connected end to end.

In the shape composed of eight concave arcs, the eight concave arcs are connected end to end.

In the shape composed of four convex arcs and four concave arcs, two ends of one of the convex arcs are respectively connected to two adjacent concave arcs, and two ends of one of the concave arcs are respectively connected to two adjacent convex arcs.

In the shape composed of six concave arcs and six convex arcs, two ends of one of the convex arcs are respectively connected to two adjacent concave arcs, and two ends of one of the concave arcs are respectively connected to two adjacent convex arcs.

In the shape composed of seven convex arcs and five concave arcs, the seven convex arcs and the five concave arcs are connected end to end. Besides, the five convex arcs and the five concave arcs are connected at intervals.

In the shape composed of eight concave arcs and eight convex arcs, two ends of one of the convex arcs are respectively connected to two adjacent concave arcs, and two ends of one of the concave arcs are respectively connected to two adjacent convex arcs.

As shown in FIG. 1, the shape of the first pixel 101 is a circular shape or an elliptical shape. The shapes of the second pixel 102 and the third pixel 103 are all the shapes formed by four convex arcs and the four concave arcs.

As shown in FIG. 2, the shape of the first pixel 101 is the circular shape or the elliptical shape, and the shape of the second pixel 102 is the circular shape or the elliptical shape. The shape of the third pixel 103 is the shape formed by four convex arcs and four concave arcs.

As shown in FIG. 3, the shape of the first pixel 101 is the circular shape or the elliptical shape, and the shape of the second pixel 102 is the shape formed by the six concave arcs and the six convex arcs. The shape of the third pixel 103 is the shape formed by the seven convex arcs and the five concave arcs.

As shown in FIG. 4, the shape of the first pixel 101 is the circular shape or the elliptical shape, and the shape of the second pixel 102 is the shape formed by the eight concave arcs and the eight convex arcs. The shape of the third pixel 103 is the shape formed by the four convex arcs and the four concave arcs.

The shape formed by the convex arc, the shape formed by the four concave arcs, the shape formed by the six concave arcs, the shape formed by the eight concave arcs, the shape formed by four convex arcs and four concave arcs, the shape formed by six concave arcs and six convex arcs, and the shape formed by eight concave arcs and eight convex arcs are all centrally symmetrical.

The shape, the size, and the area of any two of the first pixel 101, the second pixel 102, and the third pixel 103 are all different.

In the above embodiment, the shape of the first pixel, the second pixel, and the third pixel is a shape formed by a convex arc and/or a concave arc. Two of the shapes of edge portions of the first pixel, the second pixel, and the third pixel are complementary. Therefore, an unused area between the pixels in the display panel of the disclosure can be effectively reduced (decreased). Thus, the aperture ratio of the pixels can be effectively increased in the disclosure.

When the shape of the first pixel 101 is the circular shape or the elliptical shape, a shape of an edge portion of one of the second pixel 102 and the third pixel 103 in the third direction D3 and the fourth direction D4 corresponds to the concave arc, and a sum of a radius of curvature of a shape of an edge portion of the first pixel 101 toward one of the second pixel 102 and the third pixel 103 and a width of a predetermined gap is equal to a radius of curvature of a concave arc corresponding to an edge portion of one of the second pixel 102 and the third pixel 103 in the third direction D3 and the fourth direction D4.

The predetermined gap is a gap between an edge portion of one of the second pixel 102 and the third pixel 103 and an edge portion of the adjacent first pixel 101 in one of the third direction D3 and the fourth directions D4. A width of the predetermined gap in the third direction D3 is equal to the width of the predetermined gap in the fourth direction D4.

As shown in FIG. 1, the shape of the first pixel 101 is the elliptical shape. A long axis of the elliptical shape is parallel to the third direction D3, and a short axis of the elliptical shape is parallel to the fourth direction D4. In the third direction D3, a sharp of the edge portion of the second pixel 102 toward the first pixel 101 corresponds to the concave arc, and a radius of curvature of the concave arc corresponding to the edge portion of the second pixel 102 toward the first pixel 101 is equal to a sum of the long axis of the first pixel 101 and a width W1 of a gap between the first pixel 101 and the second pixel 102 in the third direction D3. In the fourth direction D4, a sharp of the edge portion of the third pixel 103 toward the first pixel 101 corresponds to the concave arc, and a radius of curvature of the concave arc corresponding to the edge portion of the third pixel 103 toward the first pixel 101 is equal to a sum of the short axis of the first pixel 101 and a width W2 of a gap between the first pixel 101 and the third pixel 103 in the fourth direction D4.

As shown in FIG. 2, the shape of the first pixel 101 is the circular shape. In the third direction D3, a sharp of the edge portion of the third pixel 103 toward the first pixel 101 corresponds to the concave arc, and a radius of curvature of the concave arc corresponding to the edge portion of the third pixel 103 toward the first pixel 101 is equal to a sum of a radius of the first pixel 101 and a width W3 of a gap between the first pixel 101 and the third pixel 103 in the third direction D3. In the fourth direction D4, a sharp of the edge portion of the third pixel 103 toward the first pixel 101 corresponds to the concave arc, and a radius of curvature of the concave arc corresponding to the edge portion of the third pixel 103 toward the first pixel 101 is equal to a sum of the radius of the first pixel 101 and a width W4 of a gap between the first pixel 101 and the third pixel 103 in the fourth direction D4.

As shown in FIG. 3, the shape of the first pixel 101 is elliptical shape. A long axis of the elliptical shape is parallel to the first direction D1, and a short axis of the elliptical shape is parallel to the second direction D2. In the third direction D3, a sharp of the edge portion of the second pixel 102 toward the first pixel 101 corresponds to the concave arc, and a radius of curvature of the concave arc corresponding to the edge portion of the second pixel 102 toward the first pixel 101 is equal to a sum of a radius of curvature of the shape of the edge portion of the first pixel 101 toward the second pixel 102 and a width W5 of a gap between the first pixel 101 and the second pixel 102 in the third direction D3. In the fourth direction D4, the shape of the edge portion of the third pixel 103 toward the first pixel 101 corresponds to the concave arc, and a radius of curvature of the concave arc corresponding to the shape of the edge portion of the third pixel 103 toward the first pixel 101 is equal to a sum of a radius of curvature of the shape of the edge portion of the first pixel 101 toward the third pixel 103 and a width W6 of a gap between the first pixel 101 and the third pixel 103 in the fourth direction D4.

As shown in FIG. 4, the shape of the first pixel 101 is the circular shape. In the third direction D3, a sharp of the edge portion of the second pixel 102 toward the first pixel 101 corresponds to the concave arc, and a radius of curvature of the concave arc corresponding to the edge portion of the second pixel 102 toward the first pixel 101 is equal to a sum of a radius of curvature of the shape of the edge portion of the first pixel 101 toward the second pixel 102 and a width W7 of a gap between the first pixel 101 and the second pixel 102 in the third direction D3. In the fourth direction D4, the shape of the edge portion of the third pixel 103 toward the first pixel 101 corresponds to a concave arc, and a radius of curvature of the concave arc corresponding to the shape of the edge portion of the third pixel 103 toward the first pixel 101 is equal to a sum of a radius of curvature of the shape of the edge portion of the first pixel 101 toward the third pixel 103 and a width W8 of a gap between the first pixel 101 and the third pixel 103 in the fourth direction D4.

A predetermined shape is constituted of an arc corresponding to an edge portion of the third pixel toward 103 toward the first pixel 101 and its extended arc and an arc corresponding to an edge portion of the second pixel 102 toward the first pixel 101 and its extended arc, and the predetermined shape is a circular shape or an elliptical shape.

As shown in FIG. 1, the predetermined shape is an elliptical shape, and as shown in FIG. 2, the predetermined shape is a circular shape. As shown in FIG. 3, the predetermined shape is an elliptical shape, and as shown in FIG. 4, the predetermined shape is a circular shape.

The shape of the first pixel 101 is the same or similar to the predetermined shape.

A center of the shape of the first pixel 101 is the same as a center of the predetermined shape.

When the shape of the first pixel 101 is an elliptical shape, a long axis of the elliptical shape directs to one of the second pixel 102 and the third pixel 103, and a short axis of the elliptical shape directs to the other one of second pixel 102 and the third pixel 103.

As shown in FIG. 1, the long axis of the elliptical shape corresponding to the shape of the first pixel 101 is directed to the second pixel 102, and correspondingly, the short axis is directed to the third pixel 103.

As shown in FIG. 3, the short axis of the elliptical shape corresponding to the shape of the first pixel 101 is directed to the second pixel 102 and the third pixel 103.

An angle between the long axis of the elliptical shape and the first direction D1 or the second direction D2 is within a range of 0 to 90 degrees.

As shown in FIG. 1, the angle between the long axis of the elliptical shape and the first direction D1 is in the range of 40 to 50 degrees. As shown in FIG. 3, the angle between the long axis of the elliptical shape and the first direction D1 is in a range of 0 to 10 degrees, and correspondingly, the angle between the long axis of the elliptical shape and the second direction D2 is in the range of 80 to 90 degrees.

When the shape of the second pixel 102 is a circular shape of an elliptical shape, and when the shape of the third pixel 103 is a shape composed of a concave arc or a combination of a concave arc and a convex arc, a curvature of one of the at least four concave arcs constituting the shape of the third pixel 103 is greater than a curvature of the other one (adjacent). That is, the curvatures of adjacent ones of the four concave arcs are not equal.

As shown in FIG. 2, the second pixel 102 is a circular shape, and a radius of a curvature of the concave arc corresponding to an edge portion of the third pixel 103 toward the second pixel 102 is larger than a radius of a curvature of the concave arc corresponding to an edge portion of the third pixel 103 toward the first pixel 101.

When the shape of the second pixel 102 and the shape of the third pixel 103 are both concave arc or a combination of a concave arc and a convex arc, a curvature of one of the at least four concave arcs constituting the shape of the third pixel 103 is greater than or equal to a curvature of one of the at least four concave arcs constituting the shape of the second pixel 102.

As shown in FIG. 1, the radius of curvature of the concave arc corresponding to the edge portion of the second pixel 102 toward the first pixel 101 is greater than a radius of curvature of the concave arc corresponding to an edge portion of the third pixel 103 toward the first pixel 101.

As shown in FIG. 3, a radius of curvature of the convex arc corresponding to the edge portion of the third pixel 103 toward the second pixel 102 is larger than a radius of curvature of the concave arc corresponding to the edge portion of the third pixel 103 toward the first pixel 101. A radius of curvature of the convex arc corresponding to the edge portion of the third pixel 103 toward the first pixel 101 is equal to a radius of curvature of the concave arc corresponding to the edge portion of the second pixel 102 toward the first pixel 101.

As shown in FIG. 4, a radius of curvature of the convex arc corresponding to the edge portion of the third pixel 103 toward the first pixel 101 is equal to a radius of curvature of the concave arc corresponding to the edge portion of the second pixel 102 toward the first pixel 101.

In the above disclosure, since the shape of the first pixel is circular or elliptical, and the shape of the edge portion in the second pixel and the third pixel corresponds to a concave arc, the sum of the radius of curvature of the shape of the edge portion of the first pixel and the width of the predetermined gap is equal to the radius of curvature of the concave arc corresponding to the edge portion of one of the second pixel and the third pixel. Thus, the disclosure can effectively reduce the unused space between pixels, thereby effectively increasing the aperture ratio of the pixel.

In the above disclosure, since the shape of the first pixel is a circular shape or an elliptical shape, the shape of the second pixel is one of a circular shape, an elliptical shape, and a shape formed by a concave arc and a convex arc, and the shape of the third pixel is a shape formed by a concave arc and a convex arc, thereby facilitating the fabrication of the pixel and effectively increasing the aperture ratio of the pixel.

A total area of all of the first pixels 101 in the pixel repeating unit (for example, an area of one of the first pixels 101, a sum of areas of the two first pixels 101), a total area of all of the second pixels 102 (for example, an area of one of the second pixels 102, a sum of areas of the second pixels 102), a total area of all of the third pixels 103 (for example, an area of one of the third pixels 103, a sum of areas of the third pixels 103) are inversely proportional to a luminous efficiency of a luminescent material of the first pixel 101, a luminous efficiency of a luminescent material of the second pixel 102, and a luminous efficiency of a luminescent material of the third pixel 103, respectively.

The ratio y1 of the aperture ratio of the red pixel to the aperture ratio of the green pixel is in the following range of $0.78e^{(-1.98r)} \leq y1 \leq 2.297e^{(-1.85r)}$, and $0.1 \leq y1 \leq 3$. Besides, r is a ratio of the luminous efficiency of the red pixel to the luminous efficiency of the green pixel. The ratio y2 of the aperture ratio of the blue pixel to the aperture ratio of the green pixel is in the following range: $1.32\ e^{(-10.7b)}$ ≤y2≤5.95e^(−14.1b), and 0.3≤y2≤4. Besides, b is a ratio of the luminous efficiency of the blue pixel to the luminous efficiency of the green pixel.

Figure 9:
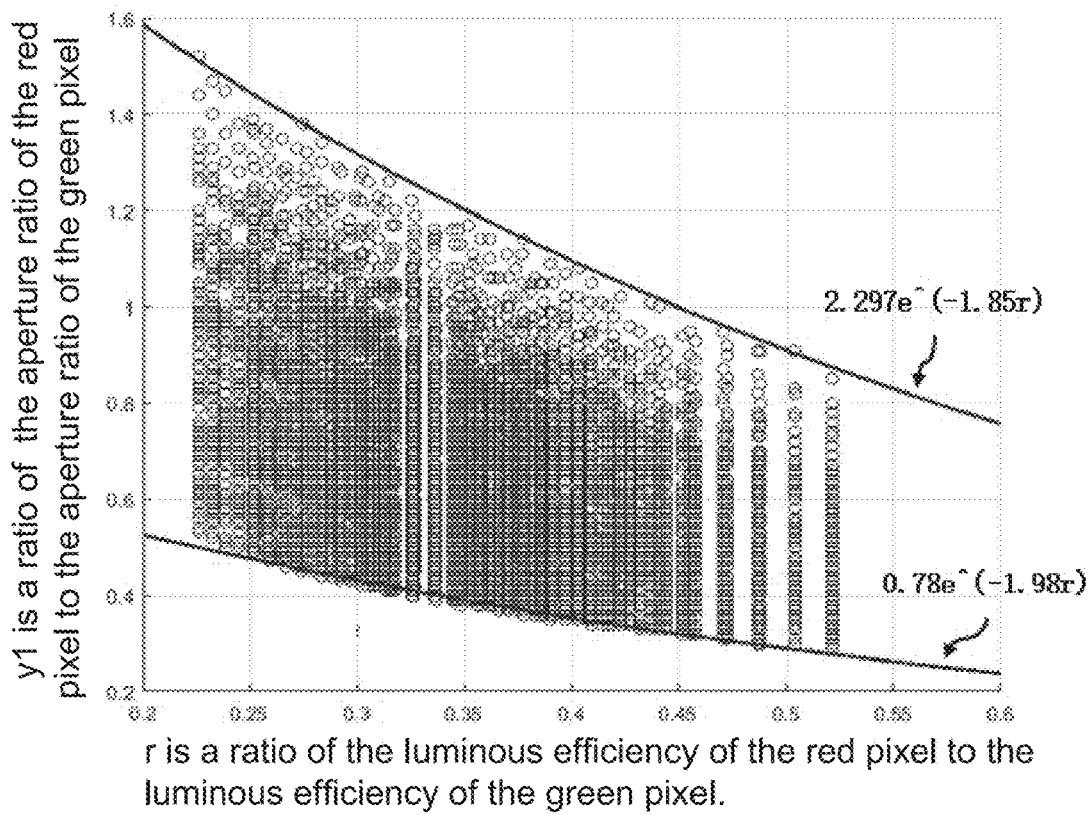
FIG. 9 is a schematic diagram of simulation data of a relationship between a ratio of an aperture ratio of a red pixel to an aperture ratio of a green pixel, and a ratio of a luminance efficiency of a red pixel to a luminance efficiency of a green pixel in the display panel of this disclosure.
Figure 10:
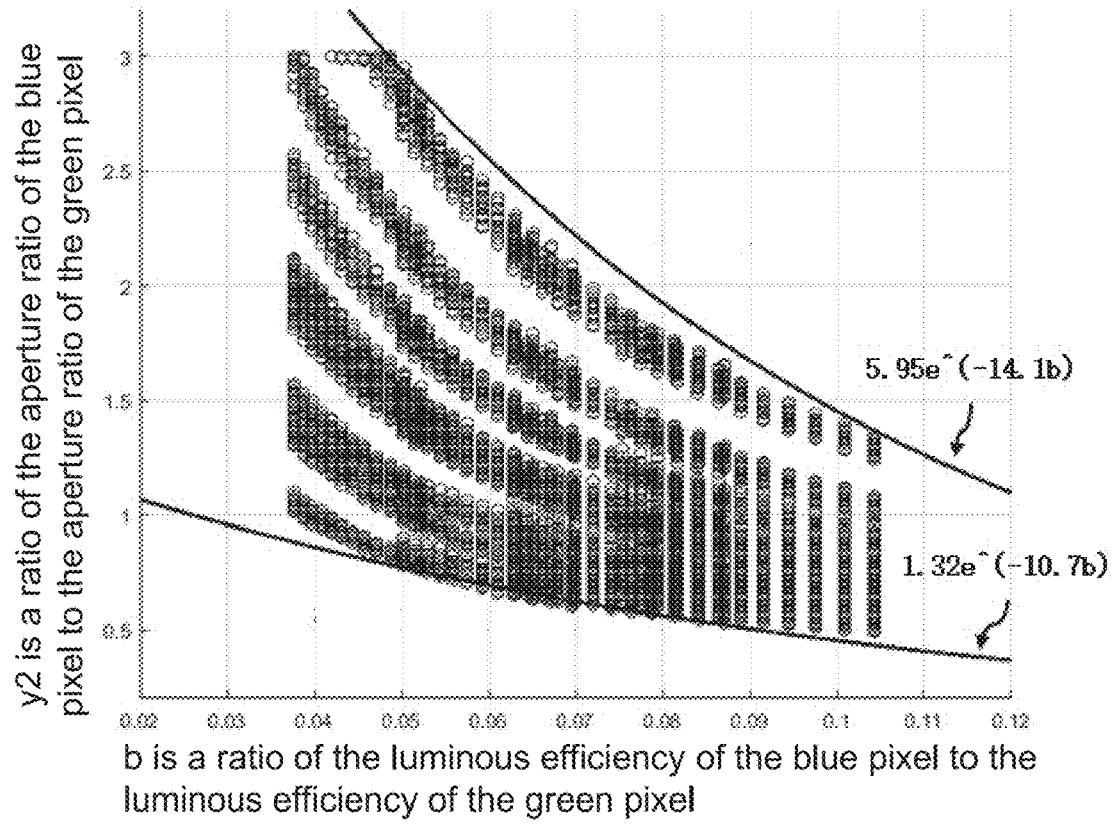
FIG. 10 is a schematic diagram of simulation data of a relationship between a ratio of an aperture ratio of a blue pixel to an aperture ratio of a green pixel, and a ratio of a luminance efficiency of a blue pixel to a luminance efficiency of a green pixel in the display panel of this disclosure.

The ratio y1 of the aperture ratio of the red pixel to the aperture ratio of the green pixel may be one of the following values, for example, 0.1, 0.2, 0.3, 0.4, 0.5, 0.6, 0.7, 0.8, 0.9, 1, 1.1, 1.2, 1.3, 1.4, 1.5 1.6, 1.7, 1.8, 1.9, 2, 2.1, 2.2, 2.3, 2.4, 2.5, 2.6, 2.7, 2.8, 2.9, 3. Preferably, the ratio y1 of an aperture ratio of the red pixel to the aperture ratio of the green pixel is within the range of 0.2 to 2.2, that is, 0.2≤y1≤2.2. The ratio y2 of the aperture ratio of the blue pixel to the aperture ratio of the green pixel may be one of the following values, for example, 0.3, 0.4, 0.5, 0.6, 0.7, 0.8, 0.9, 1, 1.1, 1.2, 1.3, 1.4, 1.5, 1.6, 1.7, 1.8, 1.9, 2, 2.1, 2.2, 2.3, 2.4, 2.5, 2.6, 2.7, 2.8, 2.9, 3, 3.1, 3.2, 3.3, 3.4, 3.5, 3.6, 3.7, 3.8, 3.9, 4. Preferably, the ratio y2 of the aperture ratio of the blue pixel to the aperture ratio of the green pixel is within the range of 0.5 to 3.6, that is, 0.5≤y2≤3.6, as shown in FIG. 9 and FIG. 10. In this range, the current densities of various material efficiencies acting on red pixels, green pixels, and blue pixels are equal or substantially equal. While under long-term use, a degree of material attenuation of the red pixels, the green pixels, and the blue pixels is similar, so that the overall color shift of the display panel can fall within a relatively good range.

The aperture ratio and the luminous efficiency of the red pixel, the green pixel, the blue pixel of the conventional display panel do not present the above characteristics (i.e., there is no: 0.78e^(−1.98r)≤y1≤2.297e^(−1.85r), and 0.1≤y1≤3, 1.32e^(−10.7b)≤y2≤5.95e^(−14.1b), and 0.3≤y2≤4). Therefore, with the accumulation of usage time, the difference in the degree of attenuation of the luminous efficiency of any two of the red pixels, the green pixels, and the blue pixels in the conventional display panel will get greater and greater, resulting in the degree of color shift (value) of the conventional display panel will gradually diverge (i.e., deviated) outside a predetermined range (numerical range of display effects). That is, the display effect of the conventional display panel will get worse.

In the display panel of the disclosure, since 0.78e^(−1.98r)≤y1≤2.297e^(−1.85r), 0.1≤y1≤3, and 1.32e^(−10.7b)≤y2≤5.95e^(−14.1b), 0.3≤y2≤4, in the case of the same usage time as the conventional display panel, the difference in the degree of attenuation of the luminous efficiency of any two of the red pixels, the green pixels, and the blue pixels in the display panel of the disclosure is minor. The degree of color shift (value) of the display panel of the disclosure remains within the predetermined range, so that the display panel of the disclosure maintains a better display effect for a longer duration than the conventional display panel maintains the same display effect.

When the pixel repeating unit includes a first pixel 101, a second pixel 102, and a third pixel 103, the aperture ratio of the first pixel 101 is equal to the area of the first pixel 101 divided by the area of the pixel repeating unit, the aperture ratio of the second pixel 102 is equal to the area of the second pixel 102 divided by the area of the pixel repeating unit, and the aperture ratio of the third pixel 103 is equal to the area of the third pixel 103 divided by the area of the pixel repeating unit.

When the pixel repeating unit includes two first pixels 101, a second pixel 102, and a third pixel 103, the aperture ratio of the first pixel 101 is equal to the area of the two first pixels 101 divided by the area of the pixel repeating unit, the aperture ratio of the second pixel 102 is equal to the area of the second pixel 102 divided by the area of the pixel repeating unit, and the aperture ratio of the third pixel 103 is equal to the area of the third pixel 103 divided by the area of the pixel repeating unit.

When the pixel repeating unit includes a first pixel 101, two second pixels 102, and a third pixel 103, the aperture ratio of the first pixel 101 is equal to the area of the first pixel 101 divided by the area of the pixel repeating unit, the aperture ratio of the second pixel 102 is equal to the area of the two the second pixels 102 divided by the area of the pixel repeating unit, and the aperture ratio of the third pixel 103 is equal to the area of the third pixel 103 divided by the area of the pixel repeating unit.

When the pixel repeating unit includes a first pixel 101, a second pixel 102, and two third pixels 103, the aperture ratio of the first pixel 101 is equal to the area of the first pixel 101 divided by the area of the pixel repeating unit, the aperture ratio of the second pixel 102 is equal to the area of the second pixel 102 divided by the area of the pixel repeating unit, and the aperture ratio of the third pixel 103 is equal to the area of the two third pixels 103 divided by the area of the pixel repeating unit.

When the shape of the first pixel 101 is elliptical, an area of the first pixel 101 corresponds to a length of a long axis and a length of a short axis of the first pixel 101. When the first pixel 101 is circular, an area of the first pixel 101 corresponds to a length of a radius of the first pixel 101.

When the shape of the second pixel 102 is a shape including a convex arc and/or a concave arc, the area of the second pixel 102 is equal to an area of a minimum circumcircle of the second pixel 102 minus a first overlapping area of a pixel gap area and the second pixel 102. Besides, the pixel gap area includes at least one of a first gap area between the first pixel 101 and the second pixel 102 and a second gap area between the second pixel 102 and the third pixel 103.

The first overlapping area corresponds to a distance between the first pixel 101 and the second pixel 102, a width of the first gap area, and a curvature of an outer peripheral edge line of the first gap area, and corresponds to a distance between the third pixel 103 and the second pixel 102, a width of the second gap area, and a curvature of an outer peripheral edge line of the second gap area.

When the shape of the third pixel 103 is a shape including a concave arc or a combination of a concave arc and a convex arc, the area of the third pixel 103 is equal to an area of a minimum circumcircle of the third pixel 103 minus a second overlapping area of a pixel gap area and the third pixel 103. Besides, the pixel gap area includes at least one of a third gap area between the third pixel 103 and the first pixel 101 and the second gap area between the second pixel 102 and the third pixel 103.

The second overlapping area corresponds to a distance between the first pixel 101 and the third pixel 103, a width of the third gap area, and a curvature of an outer peripheral edge line of the third gap area, and corresponds to a distance between the third pixel 103 and the second pixel 102, a width of the second gap area, and a curvature of the outer peripheral edge line of the second gap area.

Specifically, the shape of the first pixel 101 is elliptical, and the shape of the second pixel 102 and the shape of the third pixel 103 are all formed by convex arcs and/or concave arcs. Moreover, any two of the area of the first pixel 101, the area of the second pixel 102, and the area of the third pixel 103 are different. The shape of the second pixel 102 and the shape of third pixel 103 are different, and the size of the second pixel 102 is different from the size of the third pixel 103.

When the shape of the first pixel 101 is an elliptical shape, the ratio of the long axis to the short axis of the elliptical shape is within the range of 1 to 5. For example, the ratio is one of the following values of 1, 1.3, 1.6, 1.8, 2 2.3, 2.5, 2.8, 3, 3.3, 3.5, 3.8, 4, 4.3, 4.5, 4.8, and 5. Preferably, the ratio of the long axis to the short axis of the elliptical shape is within the range of 1 to 3.

Since the aperture ratio (area) of the red pixel, the green pixel, and the blue pixel is set according to the luminous efficiency thereof, the current density acting on the different pixels is the same. This can prevent that the degree of color shift of the display panel from exceeding a predetermined range (namely, the degree of color shift of the display panel is maintained within the predetermined range) after displaying for a long time (light emission).

The shape of the at least one of the first pixel 101, the second pixel 102, and the third pixel 103 is a shape composed of convex arcs. The remaining at most two of the first pixel 101, the second pixel 102, and the third pixel 103 are formed by convex arcs and concave arcs, and the shape of the edge portions of two of the first pixels 101, the second pixels 102, and the third pixels 103 are complementary to one of the first direction D1, the second direction D2, the third direction D3, and the fourth direction D4. Therefore, a gap disposed between any two of the first pixel 101, the second pixel 102, and the third pixel 103 must have a considerable width to prevent interference between the two pixels. The above embodiment can fully utilize the space of the display panel 10, thereby reducing redundant space he aperture ratios of the first pixel 101, the second pixel 102, and the third pixel 103 are increased.

The sum of the radius of curvature of the shape of the edge portion of the first pixel 101 toward one of the second pixel 102 and the third pixel 103 and the width of the predetermined gap is equal to the radius of curvature of the concave arc. Therefore, the aperture ratios of the first pixel 101, the second pixel 102, and the third pixel 103 can be effectively improved.

Since the two concave arcs in the shape formed by the convex arcs and/or the concave arcs are connected by the convex arc, it is convenient for manufacturing a corresponding mask plate (reducing the difficulty of manufacturing the mask plate). At the same time, it helps increase the aperture ratios of the first pixel 101, the second pixel 102, and the third pixel 103.

In the above embodiment, the area of the first pixel, the area of the second pixel, the area of the third pixel are inversely proportional to a luminous efficiency of a luminescent material of the first pixel, a luminous efficiency of the luminescent material of the second pixel, and luminous efficiency of the luminescent material of the third pixel, respectively, so that the disclosure can avoid the problem of color shift of the display panel.

Any two of the mask plate of first embodiment, the second embodiment, the third embodiment, and the fourth embodiment (a mask plate including a through hole having a first shape, a mask plate having a through hole having a second shape, a mask plate including a through hole having a third shape) of the mask plate of the disclosure are similar or alike.

The mask plate of the disclosure is used to form pixels (including the first pixel 101, the second pixel 102, and the third pixel 103). Specifically, the mask plate is used to form an anode layer of a pixel on an array device plate of the display panel 10 by an evaporation process and/or to form a luminescent material layer of a pixel on a pixel defining (defined) layer of the display panel 10. Besides, the array device plate includes a substrate, a thin film transistor switch, an insulating layer, and the like, and the pixel defining layer is disposed on the array device plate.

Through holes are disposed in the mask plate. At least two of the through holes are arranged in an array along at least two of the first direction D1, the second direction D2, the third direction D3, and the fourth direction D4. The first direction D1 is perpendicular to the second direction D2, the third direction D3 is a direction having an angle of less than 90 degrees with the first direction D1, and the fourth direction D4 is perpendicular to the third direction D3.

The shape of the through hole is a shape formed by convex arcs and/or concave arcs. That is, the shape of the through hole corresponds to the shape of the pixels (including the first pixel 101, the second pixel 102, and the third pixel 103).

The through holes of different shapes are respectively disposed on different mask plates. For example, three different shapes of through holes are respectively disposed on three different mask plates. Alternatively, the through holes of different shapes are all disposed on the same mask plate. For example, three different shapes of through holes are disposed on the same mask plate. The three different shapes include a first shape, a second shape, and a third shape.

The shape composed of the convex arcs and/or the concave arcs includes: a shape composed of four concave arcs (including a circular shape, an elliptical shape, etc.), a shape composed of six concave arcs, a shape composed of a convex arc and five concave arcs, a shape composed of eight concave arcs, a shape composed of four convex arcs and four concave arcs, a shape composed of six convex arcs and six concave arcs, a shape composed of seven convex arcs and five concave arcs, and a shape composed of eight concave arc and eight convex arc.

A first projection of the through hole having the first shape (the first through hole 201) in a predetermined coordinate system XOY and a second projection of the through hole having the second shape (the second through hole 301) in the predetermined coordinate system are staggered in any one of the first direction D1, the second direction D2, the third direction D3, and the fourth direction D4.

A first projection of the through hole having the first shape (the first through hole 201) in the predetermined coordinate system and a third projection of the through hole having the third shape (the third through hole 401) in the predetermined coordinate system are staggered in any one of the first direction D1, the second direction D2, the third direction D3, and the fourth direction D4.

A second projection having a second shape (second through hole 301) in the predetermined coordinate system and a third projection of the through hole having the third shape (third through hole 401) in the predetermined coordinate system are staggered in any one of the first direction D1, the second direction D2, the third direction D3, and the fourth direction D4.

The first projection, the second projection, and the third projection are complementary to the shapes of the opposing edge portions of the two adjacent ones of the first direction D1, the second direction D2, the third direction D3, and the fourth direction D4.

Two axes of the predetermined coordinate system are parallel to the first direction D1 and the second direction D2, respectively.

The shape of any one of the first projection, the second projection, and the third projection is a shape composed of convex arcs and/or concave arcs.

The shape of at least one of the first projection, the second projection, and the third projection is a shape composed of convex arcs. The shape of at most two of the first projection, the second projection, and the third projection is a shape composed of convex arcs, and the shape of the remaining at least two of the first projection, the second projection, and the third projection is composed of concave arcs. Alternatively, the remaining at least two of the first projection, the second projection, and the third projection are formed by a convex arc and a concave arc (a convex arc connecting the two concave arcs).

At least two of the first projection, the second projection, and the third projection are alternately arranged in at least one of the first direction D1, the second direction D2, the third direction D3, and the fourth direction D4.

Specifically, a first projection array composed of at least two of the first projections, a second projection array composed of at least two of the second projections, and a third projection array composed of at least two of the third projections are embedded in one another. At least one of the first projections is located in a range surrounded by at least four of the second projections, and at least one of the first projections is located in a range surrounded by at least four of the third projections. At least one of the second projections is located in a range surrounded by at least four of the first projections, and at least one of the second projections is located in a range surrounded by at least four of the third projections. At least one of the third projections is located in a range surrounded by at least four of the first projections, and at least one of the third projections is located in a range surrounded by at least four of the second projections.

A first gap is disposed between the first projection and the adjacent second projection, a second gap is disposed between the second projection and the adjacent third projection, and a third gap is disposed between the third projection and the adjacent first projection.

At least a portion of the third projection is protruding toward the first gap, at least a portion of the first projection is protruding toward the second gap, and at least a portion of the second projection is protruding toward the third gap.

The width of the gap between two of the first projection, the second projection, and the third projection alternately arranged in the third direction D3 is equal to the width of the gap between two of the first projection, the second projection, and the third projection alternately arranged in the fourth direction D4.

A shape of the first through hole 201 is a circular shape or an elliptical shape, a shape of the second through hole 301 is one of shapes including convex arcs and/or concave arcs, and a shape of the third through hole 401 is a shape of concave arcs or a combination of concave arcs and convex arcs. Besides, the circular shape or the elliptical shape is one of shapes composed of the convex arcs. Of course, the shape formed by the convex arcs may include other shapes.

The shape formed by the convex arc and/or the concave arc includes: a shape formed by an outer convex arc, a shape composed of four concave arcs, a shape composed of six concave arcs, a shape composed of a convex arc and five concave arcs, a shape composed of eight concave arcs, a shape composed of four convex arcs and four concave arcs, a shape composed of six concave arcs and six convex arcs, a shape composed of seven convex arcs and five concave arcs, and a shape composed of eight concave arcs and eight convex arcs.

In the shape composed of four concave arcs, the four concave arcs are connected end to end.

In the shape composed of six concave arcs, the six concave arcs are connected end to end.

In the shape composed of one convex arc and five concave arcs, the convex arc and the five concave arcs are connected end to end.

In the shape composed of eight concave arcs, the eight concave arcs are connected end to end.

In the shape composed of four convex arcs and four concave arcs, two ends of one of the convex arcs are respectively connected to two adjacent concave arcs, and two ends of one of the concave arcs are respectively connected to two adjacent convex arcs.

In the shape composed of six concave arcs and six convex arcs, two ends of one of the convex arcs are respectively connected to two adjacent concave arcs, and two ends of one of the concave arcs are respectively connected to two adjacent convex arcs.

In the shape composed of seven convex arcs and five concave arcs, the seven convex arcs and the five concave arcs are connected end to end. Besides, the five convex arcs and the five concave arcs are connected at intervals.

In the shape composed of eight concave arcs and eight convex arcs, two ends of one of the convex arcs are respectively connected to two adjacent concave arcs, and two ends of one of the concave arcs are respectively connected to two adjacent convex arcs.

Figure 5A:
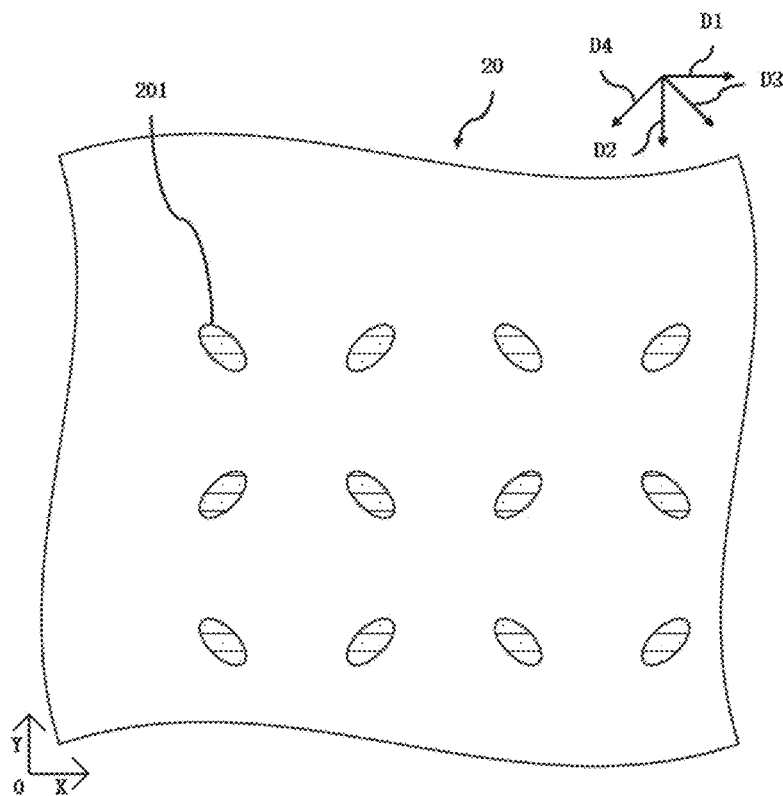
FIGS. 5A-5C are schematic diagrams of shapes and positions of a first through hole, a second through hole, and a third through hole in a first mask plate, a second mask plate, and a third mask plate, respectively, of the first embodiment of this disclosure.
Figure 5B:
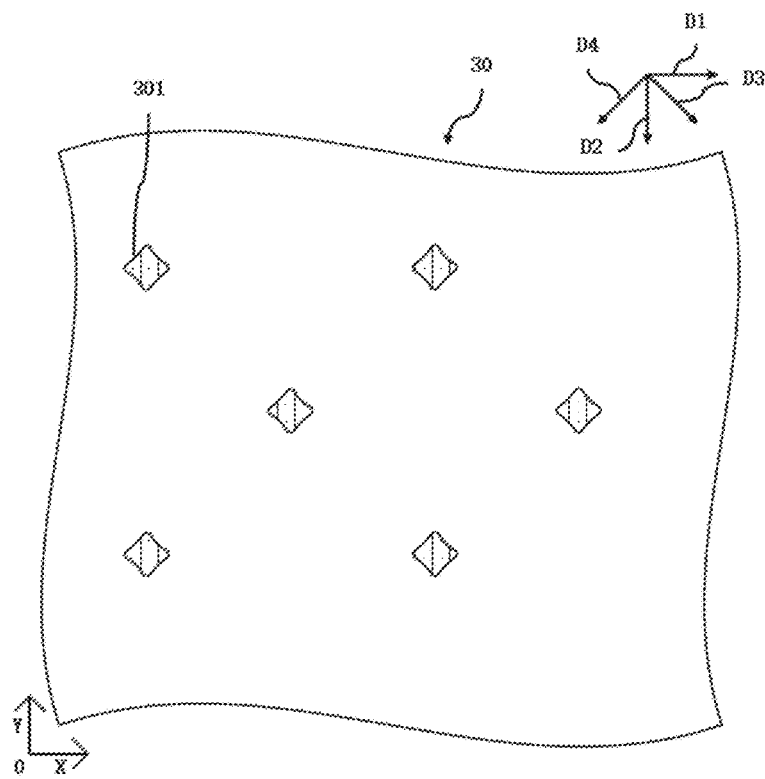
Figure 5C:
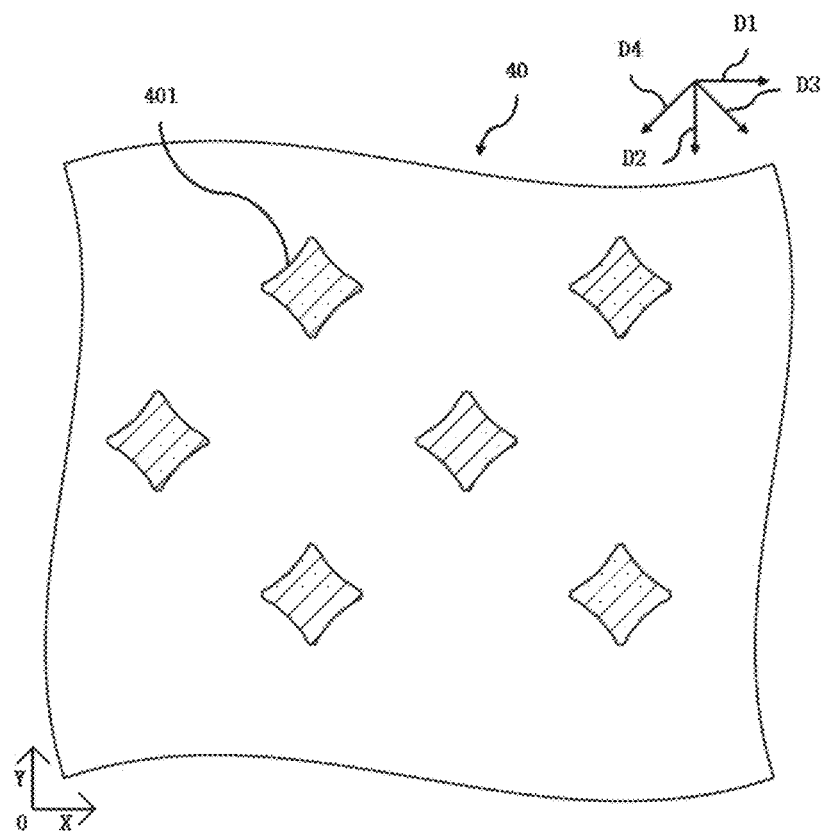

As shown in FIG. 5A, FIG. 5B, and FIG. 5C, the shape of the first through hole 201 is the circular shape or the elliptical shape. The shapes of the second through hole 301 and the third through hole 401 are all the shapes formed by four convex arcs and the four concave arcs.

Figure 6A:
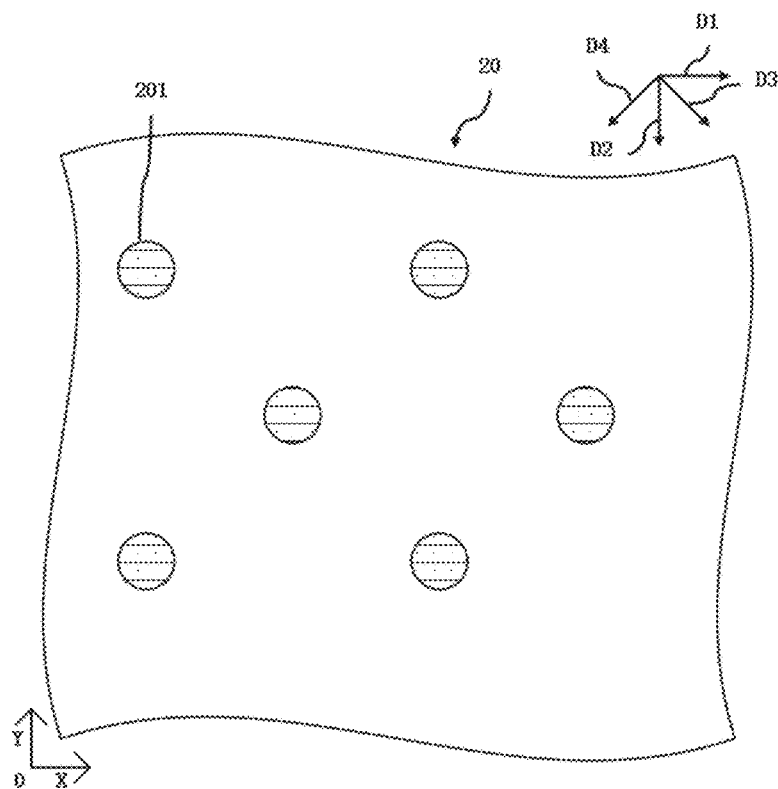
FIGS. 6A-6C are schematic diagrams of shapes and positions of a first through hole, a second through hole, and a third through hole in a first mask plate, a second mask plate, and a third mask plate, respectively, of the second embodiment of this disclosure.
Figure 6B:
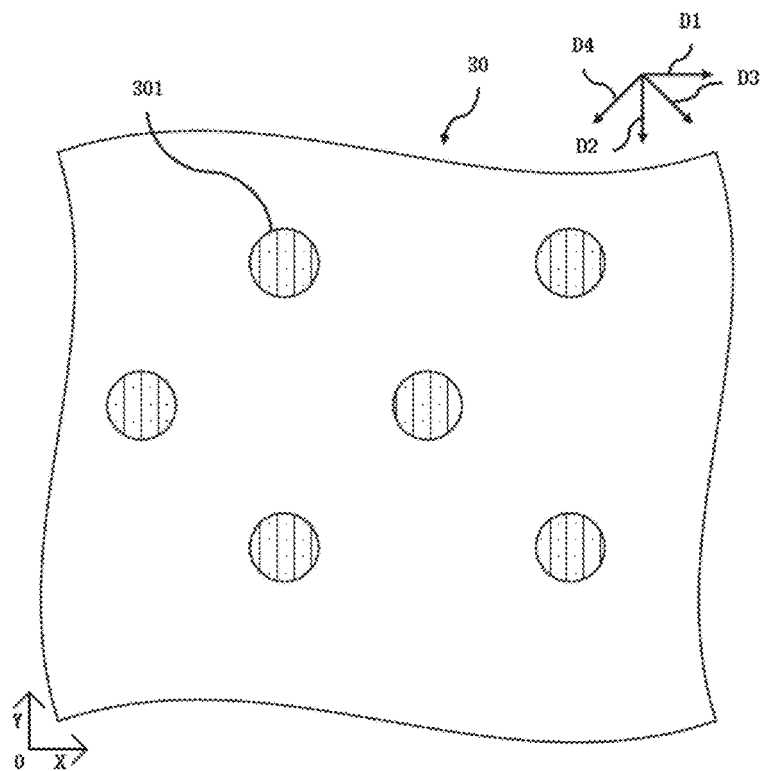
Figure 6C:
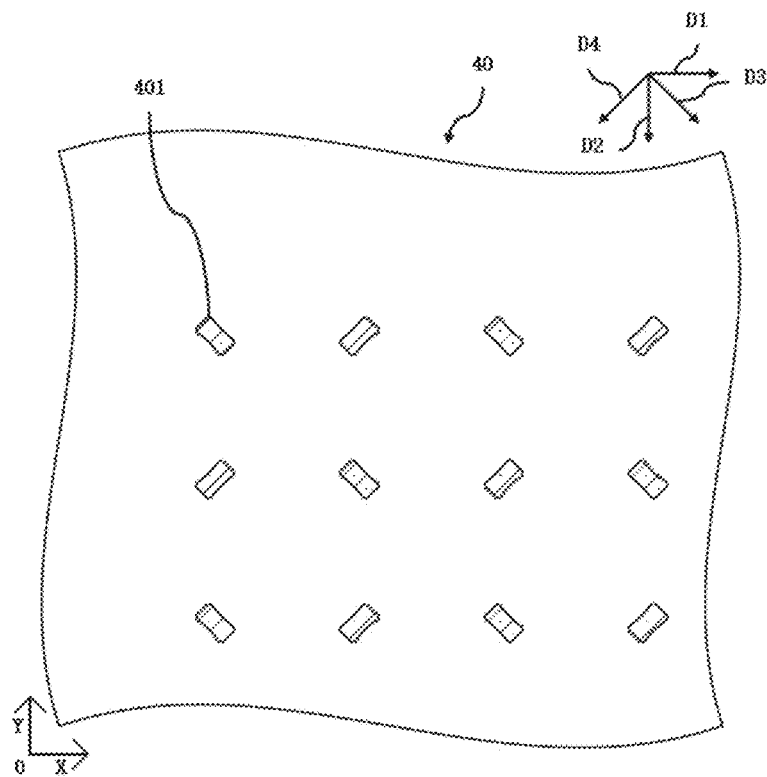

As shown in FIG. 6A, FIG. 6B, and FIG. 6C, the shape of the first through hole 201 is the circular shape or the elliptical shape, and the shape of the second through hole 301 is the circular shape or the elliptical shape. The shape of the third through hole 401 is the shape formed by the four convex arcs and the four concave arcs.

Figure 7A:
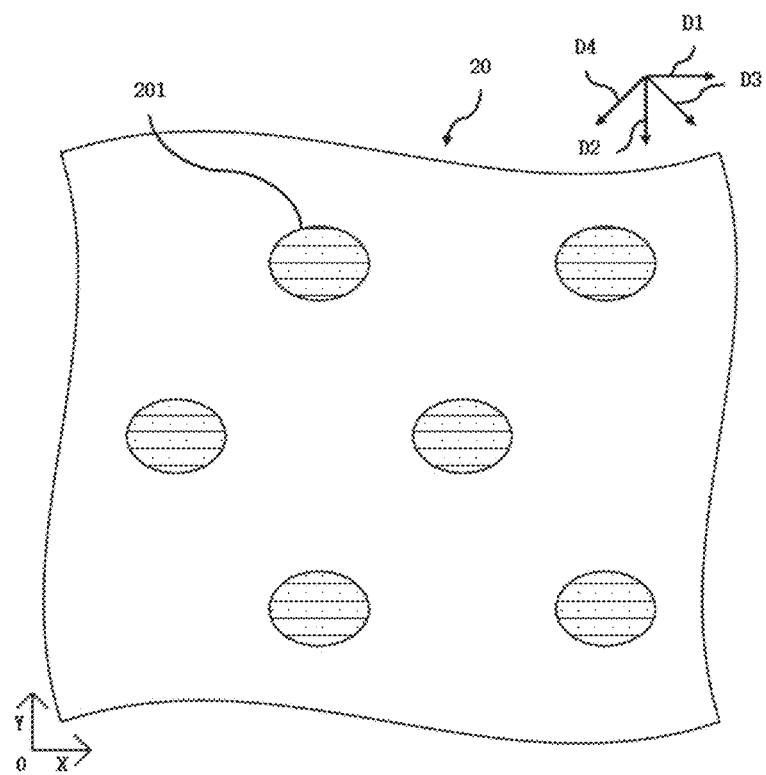
FIGS. 7A-7C are schematic diagrams of shapes and positions of a first through hole, a second through hole, and a third through hole in a first mask plate, a second mask plate, and a third mask plate, respectively, of the third embodiment of this disclosure.
Figure 7B:
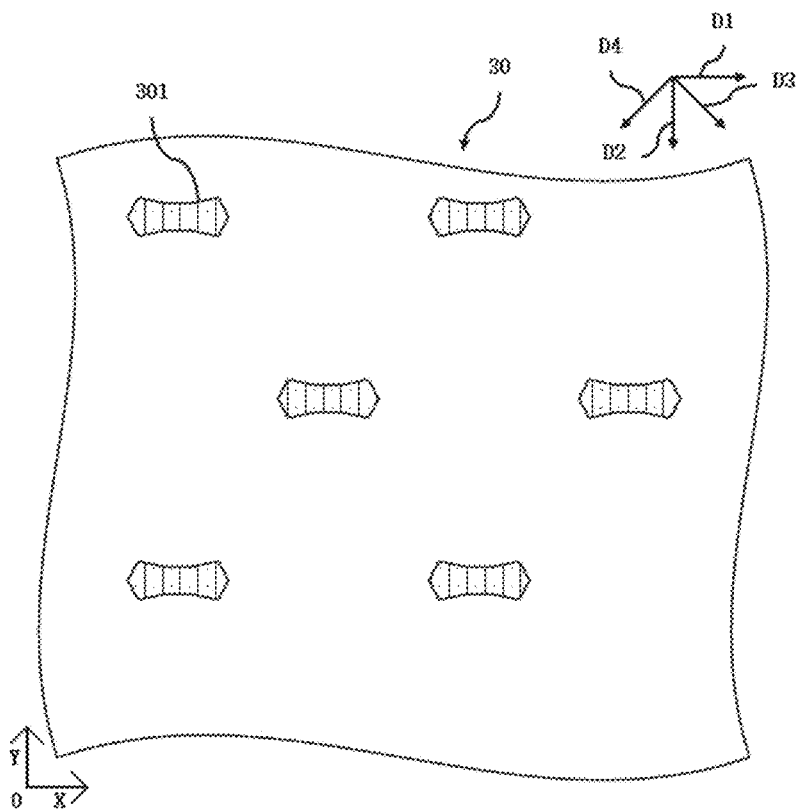
Figure 7C:
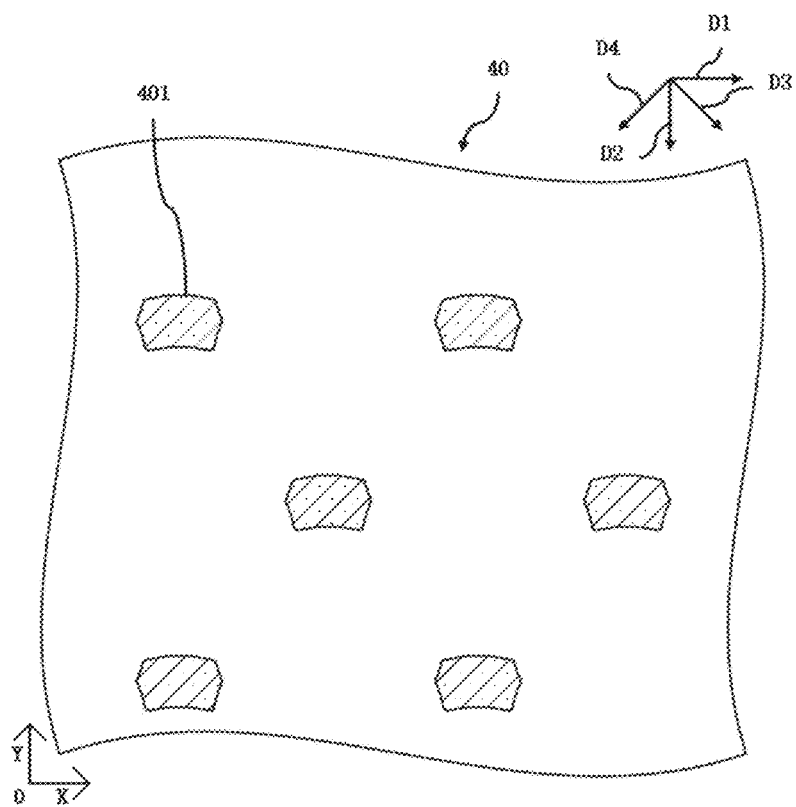

As shown in FIG. 7A, FIG. 7B, and FIG. 7C, the shape of the first through hole 201 is the circular shape or the elliptical shape, and the shape of the second through hole 301 is the shape formed by the six concave arcs and the six convex arcs. The shape of the third through hole 401 is the shape formed by the seven convex arcs and the five concave arcs.

Figure 8A:
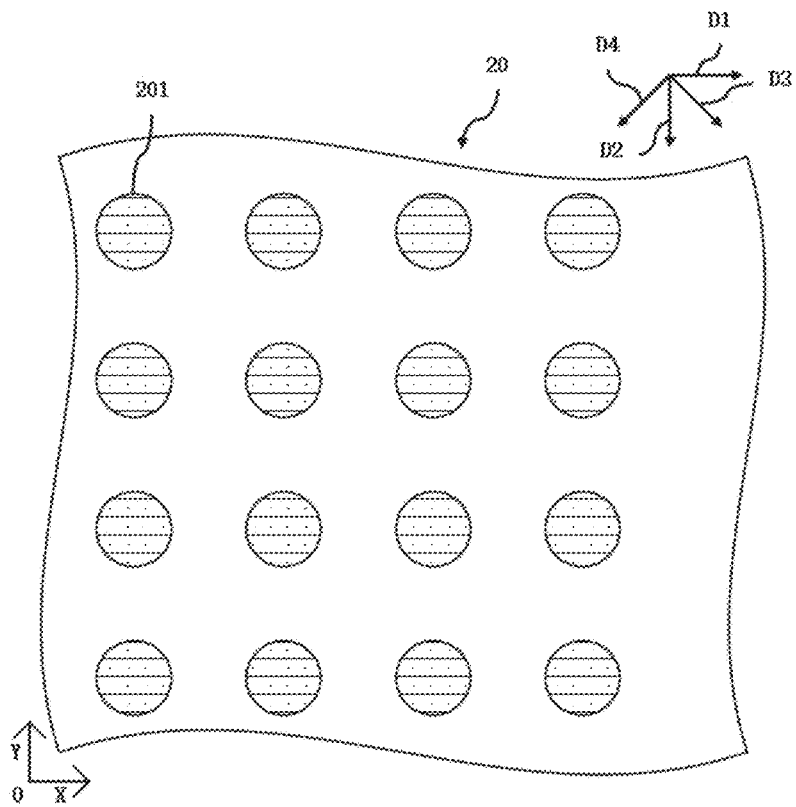
FIGS. 8A-8C are schematic diagrams of shapes and positions of a first through hole, a second through hole, and a third through hole in a first mask plate, a second mask plate, and a third mask plate, respectively, of the fourth embodiment of this disclosure.
Figure 8B:
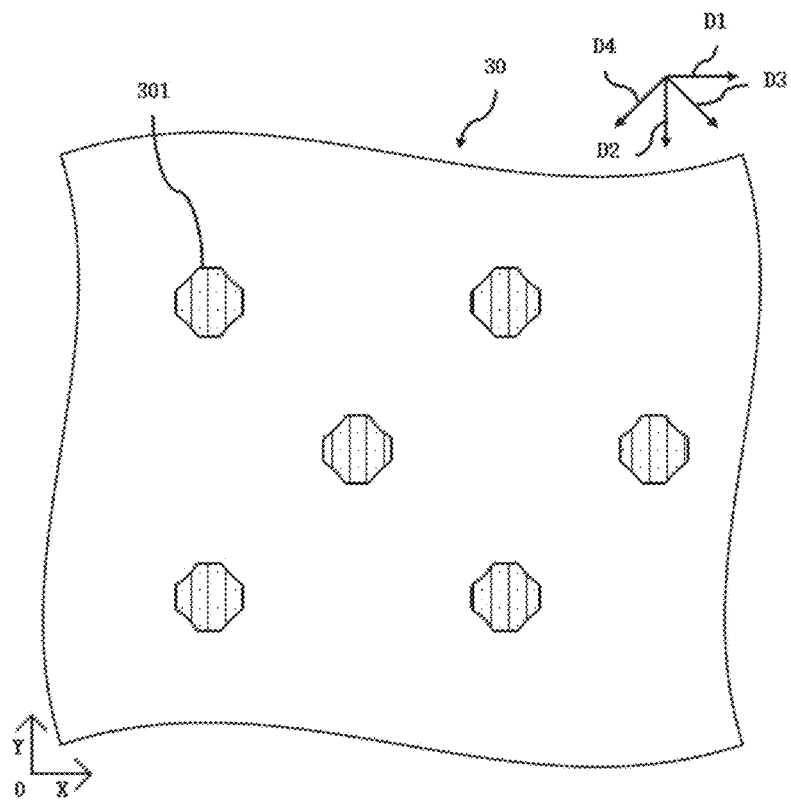
Figure 8C:
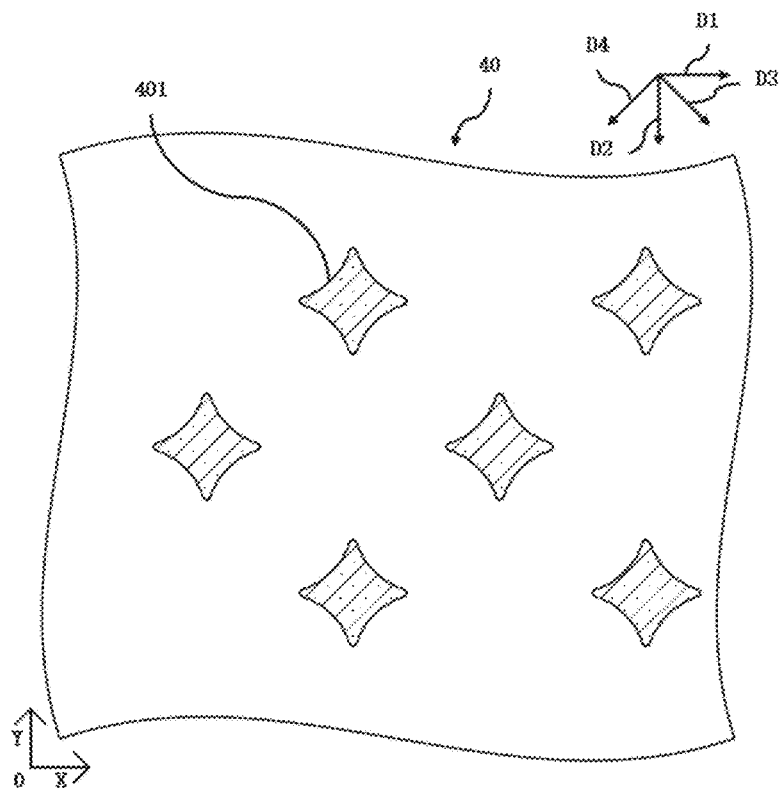

As shown in FIG. 8A, FIG. 8B, and FIG. 8C, the shape of the first through hole 201 is the circular shape or the elliptical shape, and the shape of the second through hole 301 is the shape formed by the eight concave arcs and the eight convex arcs. The shape of the third through hole 401 is the shape formed by the four convex arcs and the four concave arcs.

The shape formed by the convex arc, the shape formed by the four concave arcs, the shape formed by the six concave arcs, the shape formed by the eight concave arcs, the shape formed by four convex arcs and four concave arcs, the shape formed by six concave arcs and six convex arcs, and the shape formed by eight concave arcs and eight convex arcs are all centrally symmetrical.

The shape, the size, and the area of any two of the first projection, the second projection, and the third projection are all different.

One of the shapes of an edge portion of the second projection and the third projection in the third direction D3 and the fourth direction D4 corresponds to the concave arc.

A sum of a radius of curvature of a shape of an edge portion of the first projection toward one of the second projection and the third projection and a width of the predetermined gap is equal to a radius of curvature of the concave arc corresponding to the shape of the edge portion of one of the second projection and the third projection in the third direction D3 and the fourth direction D4.

The predetermined gap is a gap between an edge portion of one of the second projection and the third projection and an edge portion of the adjacent first projection in one of the third direction D3 and the fourth direction D4. The width of the predetermined gap in the third direction D3 is equal to the width of the predetermined gap in the fourth direction D4.

A predetermined shape is constituted of an arc corresponding to an edge portion of the third projection toward the first projection and its extended arc and an arc corresponding to an edge portion of the second projection toward the first projection and its extended arc, and the predetermined shape is circular or elliptical.

The shape of the first projection is the same or similar to the predetermined shape.

A center of the shape of the first projection is the same as a center of the predetermined shape.

When the shape of the first projection is elliptical shape, a long axis of the elliptical shape directs to one of the second projection and the third projection, and a short axis of the elliptical shape directs to the other one of second projection and the third projection.

An angle between the long axis of the elliptical shape and the first direction D1 or the second direction D2 is in the range of 0 to 90 degrees.

When the shape of the second projection is a circular shape or an elliptical shape, and the shape of the third projection is a shape composed of concave arcs or a combination of concave arcs and convex arcs, the curvature of one of the at least four concave arcs constituting the shape of the third projection is greater or less than the curvature of the other.

When the shape of the second projection and the shape of the third projection are either concave arcs or a combination of concave arcs and convex arcs, the curvature of one of the at least four concave arcs constituting the shape of the third projection is greater than or equal to the curvature of one of at least four concave arcs constituting the shape of the second projection.

Any two of the first embodiment, the second embodiment, the third embodiment, and the fourth embodiment of the mask plate assembly of the disclosure are similar or alike.

The mask plate assembly of the disclosure comprises three mask plates, each of the mask plates is provided with a through hole.

At least two of the through holes are arranged in an array along at least two of the first direction D1, the second direction D2, the third direction D3, and the fourth direction D4. The first direction D1 is perpendicular to the second direction D2, the third direction D3 is a direction having an angle of less than 90 degrees with the first direction D1, and the fourth direction D4 is perpendicular to the third direction D3.

The shape of the through hole is a shape formed by convex arcs and/or concave arcs.

The three mask plates respectively are a first mask plate 20, a second mask plate 30, and a third mask plate 40. The through hole of the first mask plate 20 is a first through hole 201, the through hole of the second mask 30 plate is a second through hole 301, and the through hole of the third mask 40 is a third through hole 401.

A first projection of the first through hole 201 in a predetermined coordinate system and a second projection of the second through hole 301 in the predetermined coordinate system are staggered in any one of the first direction D1, the second direction D2, the third direction D3, and the fourth direction D4.

The first projection of the first through hole 201 in the predetermined coordinate system and the third projection of the third through hole 401 in the predetermined coordinate system are staggered in any one of the first direction D1, the second direction D2, the third direction D3, and the fourth direction D4.

The second projection of the second through hole 301 in the predetermined coordinate system and the third projection of the third through hole 401 in the predetermined coordinate system are staggered in any one of the first direction D1, the second direction D2, the third direction D3, and the fourth direction D4.

The two axes of the predetermined coordinate system are parallel to the first direction D1 and the second direction D2, respectively.

The shape of any of the first projection, the second projection, and the third projection is a shape composed of convex arcs and/or concave arcs.

The shape of at least one of the first projection, the second projection, and the third projection is a shape composed of convex arcs. The shape of at most two of the first projection, the second projection, and the third projection is a shape composed of convex arcs, the shape of the remaining at most two of the first projection, the second projection, and the third projection is a shape composed of concave arcs. Alternatively, the remaining at most two of the first projection, the second projection, and the third projection are formed by a convex arc and a concave arc (a convex arc connecting the two concave arcs).

A shape of one of the first projection, the second projection, and the third projection is complementary to one of the first direction D1, the second direction D2, the third direction D3, and the fourth direction D4.

At least two of the first projection, the second projection, and the third projection are alternately arranged in at least one of the first direction D1, the second direction D2, the third direction D3, and the fourth direction D4.

Specifically, a first projection array composed of at least two of the first projections, a second projection array composed of at least two of the second projections, and a third projection array composed of at least two of the third projections are embedded in one another. At least one of the first projections is located in a range surrounded by at least four of the second projections, and at least one of the first projections is located in a range surrounded by at least four of the third projections. At least one of the second projections is located in a range surrounded by at least four of the first projections, and at least one of the second projections is located in a range surrounded by at least four of the third projections. At least one of the third projections is located in a range surrounded by at least four of the first projections, and at least one of the third projections is located in a range surrounded by at least four of the second projections.

A first gap is disposed between the first projection and the adjacent second projection, a second gap is disposed between the second projection and the adjacent third projection, and the third projection is disposed between the third projection and the adjacent first projection.

At least a portion of the third projection is protruding toward the first gap, at least a portion of the first projection is protruding toward the second gap, and at least a portion of the second projection is protruding toward the third gap.

The width of the gap between two of the first projection, the second projection, and the third projection alternately arranged in the third direction D3 is equal to the width of the gap between two of the first projection, the second projection, and the third projection alternately arranged in the fourth direction D4.

A shape of the first through hole 201 is a circular shape or an elliptical shape, a shape of the second through hole 301 is one of shapes including a circular shape, an elliptical shape, and a shape composed of convex arcs and/or concave arcs, and a shape of the third through hole 401 is a shape of concave arcs or a combination of concave arcs and convex arcs. Besides, the circular shape or the elliptical shape is one of shapes composed of the convex arcs. Of course, the shape formed by the convex arcs may include other shapes.

The shape formed by the convex arc and/or the concave arc includes: a shape formed by an outer convex arc, a shape composed of four concave arcs, a shape composed of six concave arcs, a shape composed of a convex arc and five concave arcs, a shape composed of eight concave arcs, a shape composed of four convex arcs and four concave arcs, a shape composed of six concave arcs and six convex arcs, a shape composed of seven convex arcs and five concave arcs, and a shape composed of eight concave arc and eight convex arc.

In the shape composed of four concave arcs, the four concave arcs are connected end to end.

In the shape composed of six concave arcs, the six concave arcs are connected end to end.

In the shape composed of one convex arc and five concave arcs, the convex arc and the five concave arcs are connected end to end.

In the shape composed of eight concave arcs, the eight concave arcs are connected end to end.

In the shape composed of four convex arcs and four concave arcs, two ends of one of the convex arcs are respectively connected to two adjacent concave arcs, and two ends of one of the concave arcs are respectively connected to two adjacent convex arcs.

In the shape composed of six concave arcs and six convex arcs, two ends of one of the convex arcs are respectively connected to two adjacent concave arcs, and two ends of one of the concave arcs are respectively connected to two adjacent convex arcs.

In the shape composed of seven convex arcs and five concave arcs, the seven convex arcs and the five concave arcs are connected end to end. Besides, the five convex arcs and the five concave arcs are connected at intervals.

In the shape composed of eight concave arcs and eight convex arcs, two ends of one of the convex arcs are respectively connected to two adjacent concave arcs, and two ends of one of the concave arcs are respectively connected to two adjacent convex arcs.

As shown in FIG. 5A, FIG. 5B, and FIG. 5C, the shape of the first through hole 201 is the circular shape or the elliptical shape. The shapes of the second through hole 301 and the third through hole 401 are all the shapes formed by four convex arcs and the four concave arcs.

As shown in FIG. 6A, FIG. 6B, and FIG. 6C, the shape of the first through hole 201 is the circular shape or the elliptical shape, and the shape of the second through hole 301 is the circular shape or the elliptical shape. The shape of the third through hole 401 is the shape formed by the four convex arcs and the four concave arcs.

As shown in FIG. 7A, FIG. 7B, and FIG. 7C, the shape of the first through hole 201 is the circular shape or the elliptical shape, and the shape of the second through hole 301 is the shape formed by the six concave arcs and the six convex arcs. The shape of the third through hole 401 is the shape formed by the seven convex arcs and the five concave arcs.

As shown in FIG. 8A, FIG. 8B, and FIG. 8C, the shape of the first through hole 201 is the circular shape or the elliptical shape, and the shape of the second through hole 301 is the shape formed by the eight concave arcs and the eight convex arcs. The shape of the third through hole 401 is the shape formed by the four convex arcs and the four concave arcs.

The shape formed by the convex arc, the shape formed by the four concave arcs, the shape formed by the six concave arcs, the shape formed by the eight concave arcs, the shape formed by four convex arcs and four concave arcs, the shape formed by six concave arcs and six convex arcs, and the shape formed by eight concave arcs and eight convex arcs are all centrally symmetrical.

The shape, the size, and the area of any two of the first projection, the second projection, and the third projection are all different.

One of the shapes of an edge portion of the second projection and the third projection in the third direction D3 and the fourth direction D4 corresponds to the concave arc.

A sum of a radius of curvature of the shape of the edge portion of the first projection toward one of the second projection and the third projection and a width of the predetermined gap is equal to a radius of curvature of the concave arc.

The predetermined gap is a gap between an edge portion of one of the second projection and the third projection and an edge portion of the adjacent first projection in one of the third direction D3 and the fourth direction D4. The width of the predetermined gap in the third direction D3 is equal to the width of the predetermined gap in the fourth direction D4.

A predetermined shape is constituted of an arc corresponding to an edge portion of the third projection toward the first projection and its extended arc and an arc corresponding to an edge portion of the second projection toward the first projection and its extended arc, and the predetermined shape is circular or elliptical.

The shape of the first projection is the same or similar to the predetermined shape.

A center of the shape of the first projection is the same as a center of the predetermined shape.

When the shape of the first projection is elliptical shape, a long axis of the elliptical shape directs to one of the second projection and the third projection, and a short axis of the elliptical shape directs to the other one of second projection and the third projection.

An angle between the long axis of the elliptical shape and the first direction D1 or the second direction D2 is in the range of 0 to 90 degrees.

When the shape of the second projection is a circular shape or an elliptical shape, and the shape of the third projection is a shape composed of concave arcs or a combination of concave arcs and convex arcs, the curvature of one of the at least four concave arcs constituting the shape of the third projection is greater or less than the curvature of the other.

When the shape of the second projection and the shape of the third projection are concave arcs or a combination of concave arcs and convex arcs, the curvature of one of the at least four concave arcs constituting the shape of the third projection is greater than or equal to the curvature of one of at least four concave arcs constituting the shape of the second projection.

In the above embodiment, since the mask plate assembly includes three mask plates, the through holes are disposed in the mask plates. The shape of the through hole is a shape composed of convex arcs and/or concave arcs. The three mask plates respectively are a first mask plate, a second mask plate, and a third mask plate. The first through hole of the first mask plate comprises a first projection in a predetermined coordinate system, the second through hole of the second mask plate comprises a second projection in the predetermined coordinate system, and the third through hole of the third mask comprises a third projection in the predetermined coordinate system. The shapes of the opposing edge portions of the adjacent ones of the first projection, the second projection, and the third projection are complementary. The first projection, the second projection. The shapes of the opposing edge portions of the adjacent two of the third projections are complementary. Therefore, the embodiment of the disclosure can reduce the unused area between the pixels in the display panel, thereby increasing the aperture ratio of the pixels.

The disclosure has been described with preferred embodiments thereof, and it is understood that many changes and modifications to the described embodiment can be carried out without departing from the scope and the spirit of the invention that is intended to be limited only by the appended claims.

What is claimed is:

1. A display panel, comprising:
at least two pixel repeating units, wherein at least two of the pixel repeating units are arranged in an array, and the pixel repeating unit comprises a first pixel, a second pixel, and a third pixel;
wherein an area of the first pixel, an area of the second pixel, and an area of the third pixel are inversely proportional to a luminous efficiency of a luminescent material of the first pixel, a luminous efficiency of a luminescent material of the second pixel, and a luminous efficiency of a luminescent material of the third pixel, respectively;
wherein the first pixel, the second pixel, and the third pixel are different ones of a red pixel, a green pixel, and a blue pixel;
wherein a shape of the first pixel, a shape of the second pixel, and a shape of the third pixel is a convex arc and/or a concave arc;
wherein a shape of an edge portion of two of the first pixel, the second pixel, and the third pixel is complementary to one of a first direction, a second direction, a third direction, and a fourth direction, and wherein the first direction is perpendicular to the second direction, the third direction is a direction having an angle of less than 90 degrees with the first direction, and the fourth direction is perpendicular to the third direction; and
wherein a shape of an edge portion of one of the second pixel and the third pixel in the third direction and the fourth direction corresponds to the concave arc, and a sum of a radius of a curvature of a shape of an edge portion of the first pixel toward one of the second pixel and the third pixel and a width of a predetermined gap is equal to a radius of a curvature of a concave arc corresponding to an edge portion of one of the second pixel and the third pixel in the third direction and the fourth direction.

2. The display panel according to claim 1, wherein a ratio of an area of the red pixel to an area of the green pixel is within a range of 0.1 to 3; and
a ratio of an area of the blue pixel to the area of the green pixel is within the range of 0.3 to 4.

3. The display panel according to claim 2, wherein the ratio of the area of the red pixel to the area of the green pixel is within a range of 0.2 to 2.2; and
the ratio of the area of the blue pixel to the area of the green pixel is within the range of 0.5 to 3.6.

4. The display panel according to claim 1, wherein at least two of the first pixel, the second pixel, and the third pixel are alternately arranged in at least one of the first direction, the second direction, the third direction, and the fourth direction.

5. A display panel, comprising:
at least two pixel repeating units, wherein at least two of the pixel repeating units are arranged in an array, and the pixel repeating unit comprises a first pixel, a second pixel, and a third pixel;
wherein an area of the first pixel, an area of the second pixel, and an area of the third pixel are inversely proportional to a luminous efficiency of a luminescent material of the first pixel, a luminous efficiency of a luminescent material of the second pixel, and a luminous efficiency of a luminescent material of the third pixel, respectively;
wherein a shape of the first pixel, a shape of the second pixel, and a shape of the third pixel is a convex arc and/or a concave arc;
wherein a shape of an edge portion of two of the first pixel, the second pixel, and the third pixel is complementary to one of a first direction, a second direction, a third direction, and a fourth direction, and wherein the first direction is perpendicular to the second direction, the third direction is a direction having an angle of less than 90 degrees with the first direction, and the fourth direction is perpendicular to the third direction; and
wherein a shape of an edge portion of one of the second pixel and the third pixel in the third direction and the fourth direction corresponds to the concave arc, and a sum of a radius of a curvature of a shape of an edge portion of the first pixel toward one of the second pixel and the third pixel and a width of a predetermined gap is equal to a radius of a curvature of a concave arc corresponding to an edge portion of one of the second pixel and the third pixel in the third direction and the fourth direction.

6. The display panel according to claim 5, wherein a ratio of an area of the first pixel to an area of the second pixel is within a range of 0.1 to 3; and
a ratio of an area of the third pixel to the area of the second pixel is within the range of 0.3 to 4.

7. The display panel according to claim 5, wherein the ratio of the area of the first pixel to the area of the second pixel is within a range of 0.2 to 2.2; and
the ratio of the area of the third pixel to the area of the second pixel is within the range of 0.5 to 3.6.

8. The display panel according to claim 5, wherein at least two of the first pixel, the second pixel, and the third pixel are alternately arranged in at least one of the first direction, the second direction, the third direction, and the fourth direction.

9. The display panel according to claim 8, wherein a width of a gap between two of the first pixel, the second pixel, and the third pixel alternately arranged in the third direction is equal to a width of a gap between two of the first pixel, the second pixel, and the third pixel alternately arranged in the fourth direction.

10. The display panel according to claim 5, wherein a shape of the first pixel is a circular shape or an elliptical shape, a shape of the second pixel is one of shapes including a convex arc and/or a concave arc, and a shape of the third pixel is a shape of a concave arc or a combination of a concave arc and a convex arc.

11. The display panel according to claim 10, wherein when the shape of the first pixel is the elliptical shape, a ratio of a long axis to a short axis of the elliptical shape is within the range of 1 to 5.

12. The display panel according to claim 11, wherein the ratio of the long axis to the short axis of the elliptical shape is within the range of 1 to 3.

13. The display panel according to claim 5, wherein the predetermined gap is a gap between one of an edge portion of one of the second pixel and the third pixel and an edge portion of an adjacent first pixel in one of the third direction and the fourth direction, and a width of the predetermined gap in the third direction is equal to a width of the predetermined gap in the fourth direction.

14. The display panel according to claim 10, wherein when the shape of the first pixel is the elliptical shape, a long axis of the elliptical shape directs to one of the second pixel and the third pixel, and a short axis of the elliptical shape directs to another one of second pixel and the third pixel.

15. The display panel according to claim 5, wherein a predetermined shape is constituted of an arc corresponding to an edge portion of the third pixel toward the first pixel and its extended arc and an arc corresponding to an edge portion of the second pixel toward the first pixel and its extended arc; and
    a center of the shape of the first pixel is the same as a center of the predetermined shape.

16. The display panel according to claim 15, wherein the shape of the first pixel is the same or is a similar shape as the predetermined shape.

17. The display panel according to claim 5, wherein shape, size, and area of any two of the first pixel, the second pixel, and the third pixel are different.

\* \* \* \* \*

UNITED STATES PATENT AND TRADEMARK OFFICE
CERTIFICATE OF CORRECTION

| | | |
|---|---|---|
| PATENT NO. | : 11,038,000 B2 | Page 1 of 1 |
| APPLICATION NO. | : 16/499270 | |
| DATED | : June 15, 2021 | |
| INVENTOR(S) | : Yong Zhao | |

It is certified that error appears in the above-identified patent and that said Letters Patent is hereby corrected as shown below:

On the Title Page

Item (30) should be added as follows:
Foreign Application Priority Data
Jan. 31, 2019 (CN)....................... 201910100284.4

Signed and Sealed this
Eighteenth Day of October, 2022

*Katherine Kelly Vidal*

Katherine Kelly Vidal
*Director of the United States Patent and Trademark Office*